United States Patent
Broussev et al.

(10) Patent No.: US 10,483,911 B2
(45) Date of Patent: Nov. 19, 2019

(54) MOS TRANSISTOR-BASED RF SWITCH TOPOLOGIES FOR HIGH SPEED CAPACITIVE TUNING OF OSCILLATORS

(71) Applicant: Intel Corporation, Santa Clara, CA (US)

(72) Inventors: Svetozar Broussev, Linz (AT); Andreas Jörn Leistner, Grasbrunn (DE); Andreas Roithmeier, Munich (DE); Thomas Gustedt, München (DE)

(73) Assignee: Intel Corporation, Santa Clara, CA (US)

(*) Notice: Subject to any disclaimer, the term of this patent is extended or adjusted under 35 U.S.C. 154(b) by 186 days.

(21) Appl. No.: 15/392,527

(22) Filed: Dec. 28, 2016

(65) Prior Publication Data
US 2018/0083573 A1 Mar. 22, 2018

Related U.S. Application Data

(60) Provisional application No. 62/395,918, filed on Sep. 16, 2016.

(51) Int. Cl.
*H03B 5/12* (2006.01)

(52) U.S. Cl.
CPC ......... *H03B 5/1243* (2013.01); *H03B 5/1215* (2013.01); *H03B 5/1228* (2013.01); *H03B 5/1265* (2013.01)

(58) Field of Classification Search
CPC .. H03B 5/1229; H03B 5/1215; H03B 5/1228; H03B 5/1265; H03B 5/1243;
(Continued)

(56) References Cited

U.S. PATENT DOCUMENTS 8,860,492 B2 * 10/2014 Yang ............... H03K 17/28
327/19
9,325,332 B2 * 4/2016 Ainspan ............ H03B 1/00
(Continued)

FOREIGN PATENT DOCUMENTS

KR 1020100073948 7/2010
WO 2018052630 3/2018

OTHER PUBLICATIONS

"International Application Serial No. PCT/US2017/047134, International Search Report dated Nov. 24, 2017", 3 pgs.
(Continued)

*Primary Examiner* — Arnold M Kinkead
(74) *Attorney, Agent, or Firm* — Schwegman Lundberg & Woessner, P.A.

(57) ABSTRACT

Various designs for MOS transistor-based RF switch topologies for high speed capacitive tuning of oscillators switch circuits include a main switch device comprising a gate connected to a control terminal, a drain connected to a first terminal that is connected to the first capacitor, and a source connected to a second terminal that is connected to the second capacitor. The switch further comprises a first NMOS device having a gate connected to the main switch device gate, a source connected to a ground, and a drain connected to the first terminal. The switch further comprises a second NMOS device having a gate connected to the main switch device gate, a source connected to a ground, and a drain connected to the second terminal. The switch further comprises a pair of PMOS devices each having drains connected respectively to the first and second terminals.

17 Claims, 18 Drawing Sheets

(58) Field of Classification Search
CPC ... H03B 5/124; H03B 5/1206; H03L 2207/50; H03L 7/099; H03L 7/0991
USPC .................. 331/167, 117 FE, 179, 177 V
See application file for complete search history.

(56) References Cited

U.S. PATENT DOCUMENTS

| | | |
|---|---|---|
| 2008/0186103 A1 | 8/2008 | Chen |
| 2009/0066431 A1* | 3/2009 | Shin .................. H03B 5/1852 331/117 FE |
| 2011/0248787 A1 | 10/2011 | Jiang |
| 2012/0223771 A1 | 9/2012 | Zhang |
| 2015/0357977 A1 | 12/2015 | Bonaccio et al. |

OTHER PUBLICATIONS

"International Application Serial No. PCT/US2017/047134, Written Opinion dated Nov. 24, 2017", 7 pgs.

* cited by examiner

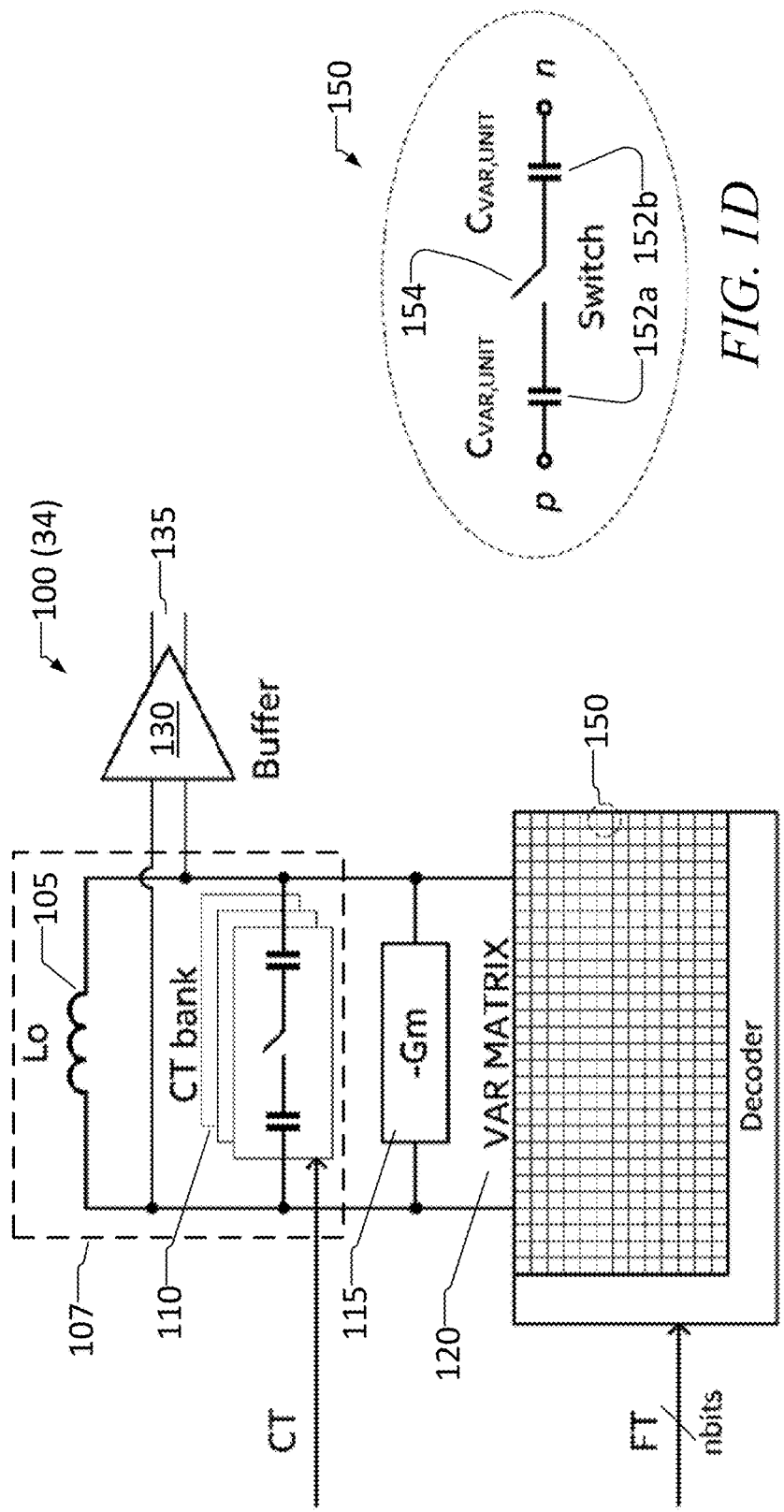

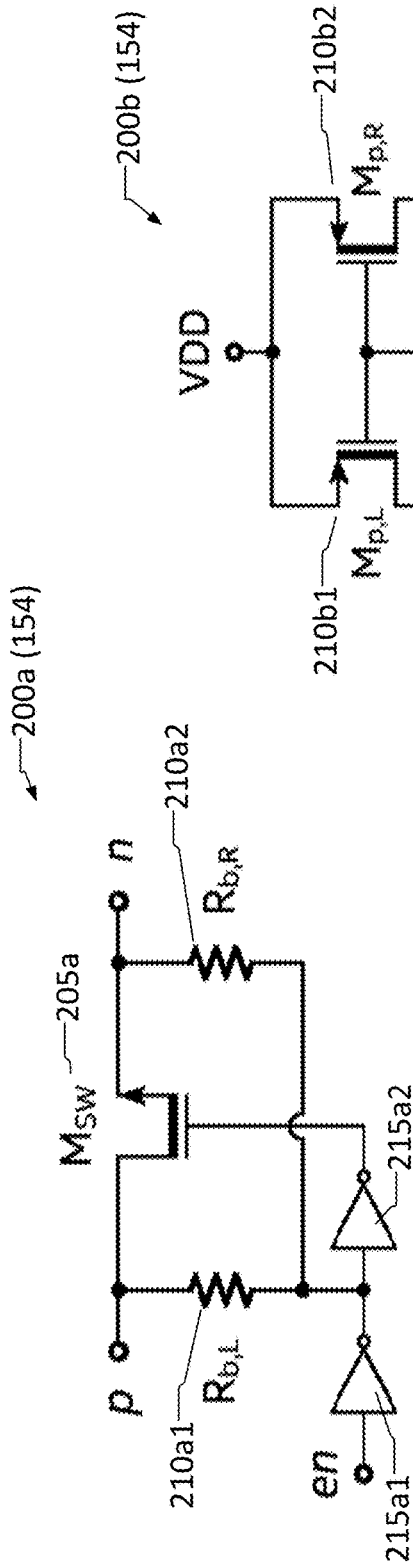
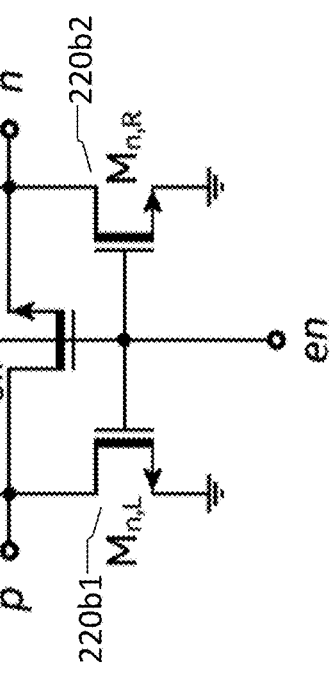
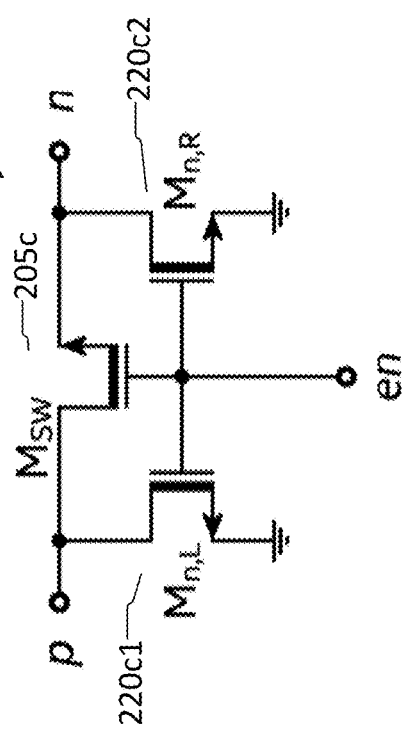
FIG. 2A (RELATED ART)
FIG. 2B (RELATED ART)
FIG. 2C (RELATED ART)

MOS TRANSISTOR-BASED RF SWITCH TOPOLOGIES FOR HIGH SPEED CAPACITIVE TUNING OF OSCILLATORS

CROSS REFERENCE TO RELATED APPLICATIONS

The present application claims the benefit of U.S. Provisional Application No. 62/395,918, filed Sep. 16, 2016, entitled, "MOS Transistor-Based RF Switch Topologies for High Speed Capacitive Tuning of Oscillators," herein incorporated by reference.

TECHNICAL FIELD

The present disclosure relates to radio frequency (RF) digitally controlled oscillators (DCOs) and switches incorporated therein that may be utilized in, for example, wireless communications, wireless communication devices, polar-modulation based transceivers, and other oscillator-based devices.

BACKGROUND

A non-symmetrical transient frequency response can be caused by switching tuning capacitances, which may be observed with frequency modulated DCOs used in polar modulation transmitter architectures. The non-symmetrical switching transient is caused by largely different time constants for turning off and turning on the tuning capacitances in the unity (varactor) cells of a digital varactor. These varactor cells are distinguished from a varactor as voltage controlled capacitance used in VCOs. The turning off and on of the varactor cells means closing/opening the RF signal path through the capacitance by opening/closing a switch that is connected in series to the capacitance(s) which increases/decreases the effective capacitance. The non-symmetrical transient distorts the output wave form of the transmitted signal, and thus it causes degradation in signal quality parameters like Error Vector Magnitude (EVM).

BRIEF DESCRIPTION OF THE DRAWINGS

FIG. 1C is a simplified schematic block diagram of a frequency-modulated DCO and its main building blocks, in accordance with some aspects of the inventive subject matter;

FIG. 1D is a schematic diagram of a unity cell varactor, in accordance with some aspects of the inventive subject matter;

FIG. 2A is a schematic diagram of a related art resistor-biased switch to turn a capacitor on and off;

FIG. 2B is a schematic diagram of a related art complementary metal oxide semiconductor (CMOS) switch to turn a capacitor on and off;

FIG. 2C is a schematic diagram of a related art n-channel metal oxide semiconductor (NMOS)-only switch to turn a capacitor on and off;

DETAILED DESCRIPTION

Figure 1A:
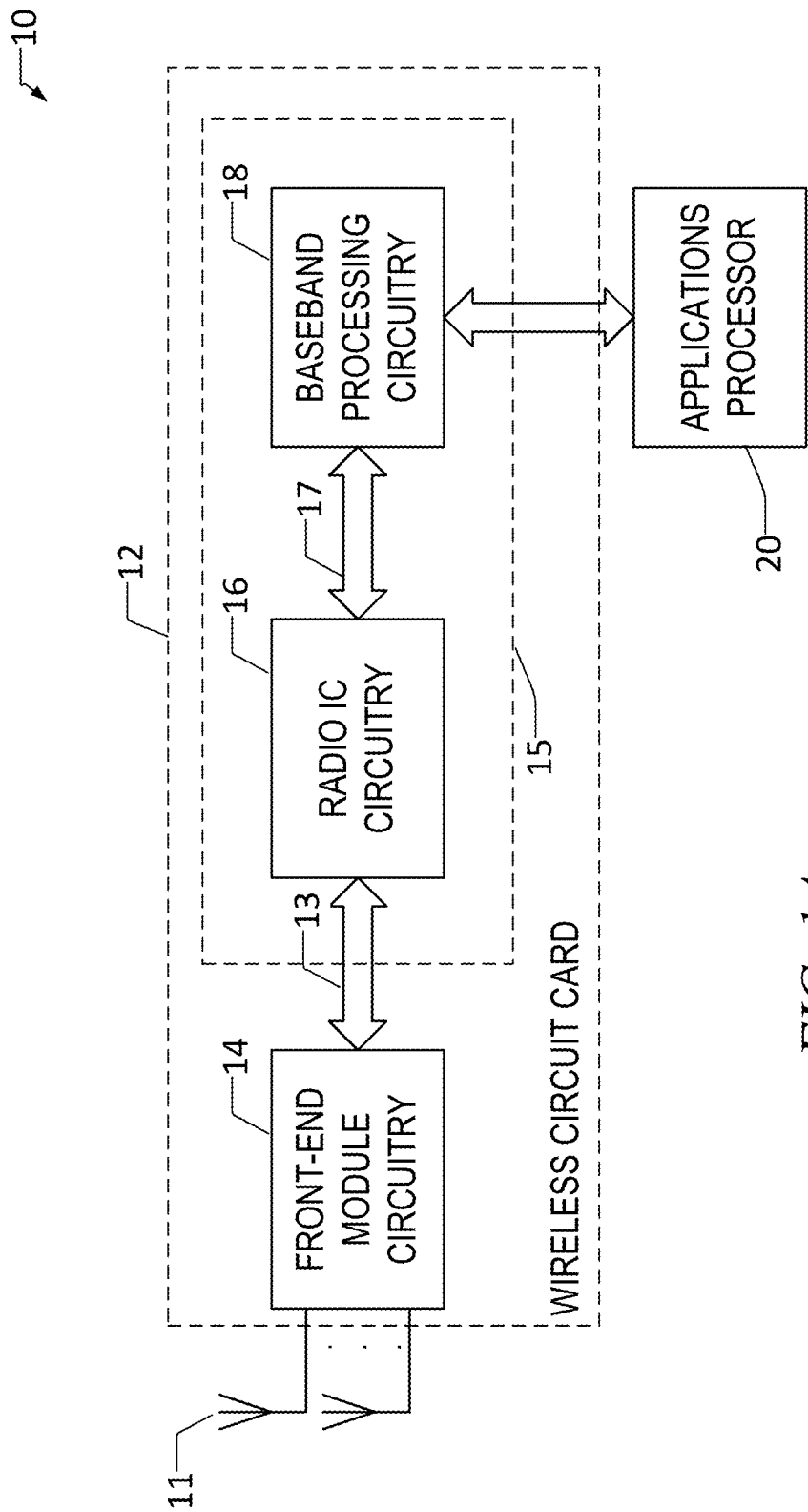
FIG. 1A is a block diagram of a radio architecture that may use a frequency modulated DCO, in accordance with some aspects of the inventive subject matter.

The following is a detailed description of various configurations depicted in the accompanying drawings. However, the amount of detail offered is not intended to limit anticipated variations of the described configurations; to the contrary, the claims and detailed description are to cover all modifications, equivalents, and alternatives falling within the spirit and scope of the present teachings as defined by the claims. The detailed descriptions below are designed to make such configurations understandable to a person having ordinary skill in the art.

Various varactor switch topologies are described that may mitigate the non-symmetrical switching transient described above. A principle employed herein is a provision of finite impedance for turning off a varactor cell, which reduces a large difference between time constants for turning on and turning off a varactor. The finite impedance should be understood by one of ordinary skill in the art as an impedance less than an open circuit. The finite impedance may be realized, e.g., with a switched off metal oxide semiconductor (MOS) device (either PMOS or NMOS type), which biases internal circuitry nodes to a known potential. As a direct consequence of the finite impedance, this principle reduces the modulation distortion seen in state-of-the-art solutions. The proposed solutions utilize a large finite impedance, which help to preserve a quality factor on LC DCOs, and therefore it prevents any degradation of DCO phase noise performance.

Disclosed herein is a digitally controlled oscillator, comprising an inductor and a varactor matrix unit connected in parallel with the inductor as well as switch topologies for tuning capacitors. These topologies can be used to build a digital varactor that is a digital-to-analog converter (DAC) that converts a digital control signal (fine tuning (FT)) into a capacitance value that is used to tune the frequency of an oscillator and so realize a digital controlled oscillator (DCO). One possible implementation of this digital varactor DAC is to use a thermometer DAC concept, that is a "matrix" of identical unity cells all connected in parallel on the analog/RF output side and output capacitance of this DAC or digital varactor is defined by number of unity cells that are turned ON. Other implementation may be to use binary coded/weighted cells or combination of thermo/binary weighted cells. The switch topologies of the patent application can be used to realize the (unity) cells used inside the digital varactor. The varactor matrix is built from (unity) cells and each cell comprises the capacitors and switches.

In one aspect, the varactor matrix unit comprises a first and second capacitor and a switch connected between the first and second capacitors. The switch comprises a main switch device comprising a gate connected to a control terminal, a drain connected to a first terminal that is connected to the first capacitor, and a source connected to a second terminal that is connected to the second capacitor. The switch further comprises a first NMOS device comprising a gate connected to the main switch device gate, a source connected to a ground, and a drain connected to the first terminal. The second NMOS device further comprises a gate connected to the main switch device gate, a source connected to a ground, and a drain connected to the second terminal. The switch further comprises pair of PMOS devices each comprising drains connected respectively to the first and second terminals and configured to provide a finite resistance and predefined DC voltage to the first and second NMOS devices when an off control signal is applied to the control terminal and the main switch device and NMOS devices are in an off state. The inductor and varactor matrix unit are configured to produce an oscillating signal via inductance of the inductor and capacitance of the varactor matrix.

Disclosed herein is also a switch circuit for a digitally controlled oscillator having a low varactor switching transient, comprising a main switch device comprising a gate connected to a control terminal, a drain connected to a first terminal that is connected to the first capacitor, and a source connected to a second terminal that is connected to the second capacitor. The switch further comprises a first NMOS device having a gate connected to the main switch device gate, a source connected to a ground, and a drain connected to the first terminal. The switch further comprises a second NMOS device having a gate connected to the main switch device gate, a source connected to a ground, and a drain connected to the second terminal. The switch further comprises a pair of PMOS devices each having drains connected respectively to the first and second terminals and configured to provide a finite resistance and predefined DC voltage to the first and second NMOS devices when an off control signal is applied to the control terminal and the main switch device and NMOS devices are in an off state.

Disclosed herein is also a switch circuit for a varactor matrix of a digitally controlled oscillator, comprising a main switch device, first and second NMOS devices, and first through fourth PMOS devices. The main switch device comprises a gate connected to a control terminal, a drain connected to a first terminal, and a source connected to a second terminal. The first NMOS device comprises a gate connected to the main switch device gate, a drain connected to the first terminal, and a source connected to a ground. The second NMOS device comprises a gate connected to the main switch device gate, a drain connected to the second terminal, and a source connected to the ground. The first PMOS device comprises a source and a drain connected to the first terminal. The second PMOS device comprises a source and a drain connected to the second terminal. The third PMOS device comprises a drain connected to the source of the first PMOS device. The fourth PMOS device comprises a drain connected to the source of the second PMOS device.

Disclosed herein is also a method of operating a varactor matrix switch, comprising receiving an off control signal defining a switch off state at a gate of a main switch device. In response to receiving the off control signal, the method further comprises turning off the main switch device, turning off a first NMOS device comprising a gate connected to the main switch device gate in response to the off control signal, and turning off a second NMOS device comprising a gate connected to the main switch device gate in response to the off control signal. The method further comprises providing a finite resistance and predefined direct current (DC) voltage to the first NMOS device at a first terminal connection that connects a drain of the main switch device, a drain of the first NMOS device, and a drain of a first PMOS device while the switch is in the off state, and providing a finite resistance and predefined direct current (DC) voltage to the second NMOS device at a second terminal connection that connects a source of the main switch device, a drain of the second NMOS device, and a drain of a second PMOS device while the switch is in the off state. The providing of the finite resistance and predefined DC voltage to the first NMOS device comprises passing a signal received at the first terminal through a drain and a gate of the first PMOS device with the first element gate and source being connected to ground. The providing of the finite resistance and predefined DC voltage to the second NMOS device comprises passing a signal received at the second terminal through a drain and a gate of the second PMOS device with the first element gate and source being connected to ground.

FIG. 1A is a block diagram of a radio architecture 10 that may use a frequency-modulated DCO, in accordance with some aspects of the inventive subject matter. In some aspects, some or all of the techniques or operations described herein may be applicable to the radio architecture 10 or other radio architectures. Some or all of the techniques described herein may be applicable to communication devices or other devices that may include a radio architecture such as 10 or other. However, the scope of the aspects described herein is not limited in this respect, as some or all of the techniques or operations described herein may be applicable to other devices or architectures, in some configurations. In some configurations, some or all of the techniques or operations described herein may be applicable to devices or architectures that may not necessarily be related to a radio architecture or communication device.

Referring to FIG. 1A, the radio architecture 10 may include front-end module circuitry 14, radio IC circuitry 16 and baseband processing circuitry 18. Front-end module circuitry 14 may include a receive signal path which may include circuitry configured to operate on RF signals received from one or more antennas 11, amplify the received signals, and provide the amplified versions of the received signals to the radio IC circuitry 16 for further processing via a communications link 13. Front-end module circuitry 14 may also include a transmit signal path which may include circuitry configured to amplify signals for transmission provided by the radio IC circuitry 16 for transmission by one or more of the antennas 11.

Radio IC circuitry 16 may include a receive signal path which may include circuitry to down-convert RF signals received from the front-end module circuitry 14 and provide baseband signals to the baseband processing circuitry 18 via a communications link 17. Radio IC circuitry 16 may also include a transmit signal path which may include circuitry to up-convert baseband signals provided by the baseband processing circuitry 18 and provide RF output signals to the front-end module circuitry 14 for subsequent transmission.

Baseband processing circuitry 18 may include one or more processors and control logic to process the baseband signals received from the receive signal path of the radio IC circuitry 16 and to generate the baseband signals for the transmit signal path of the radio IC circuitry 16. Baseband processing circuitry 18 may interface with applications processor 20 for generation and processing of the baseband signals and for controlling operations of the radio IC circuitry 16.

In some configurations, the antennas 11, the front-end module circuitry 14, the radio IC circuitry 16, and baseband processing circuitry 18 may be provided on a single circuit card, such as wireless circuit card 12, although the scope of the configurations is not limited in this respect. In some other configurations, the antennas 11, the front-end module circuitry 14 and the radio IC circuitry 16 may be provided on a single circuit card. In some configurations, the radio IC circuitry 16 and the baseband processing circuitry 18 may be provided on a single chip or integrated circuit (IC), such as IC 15, although the scope of the configurations is not limited in this respect.

Figure 1B:
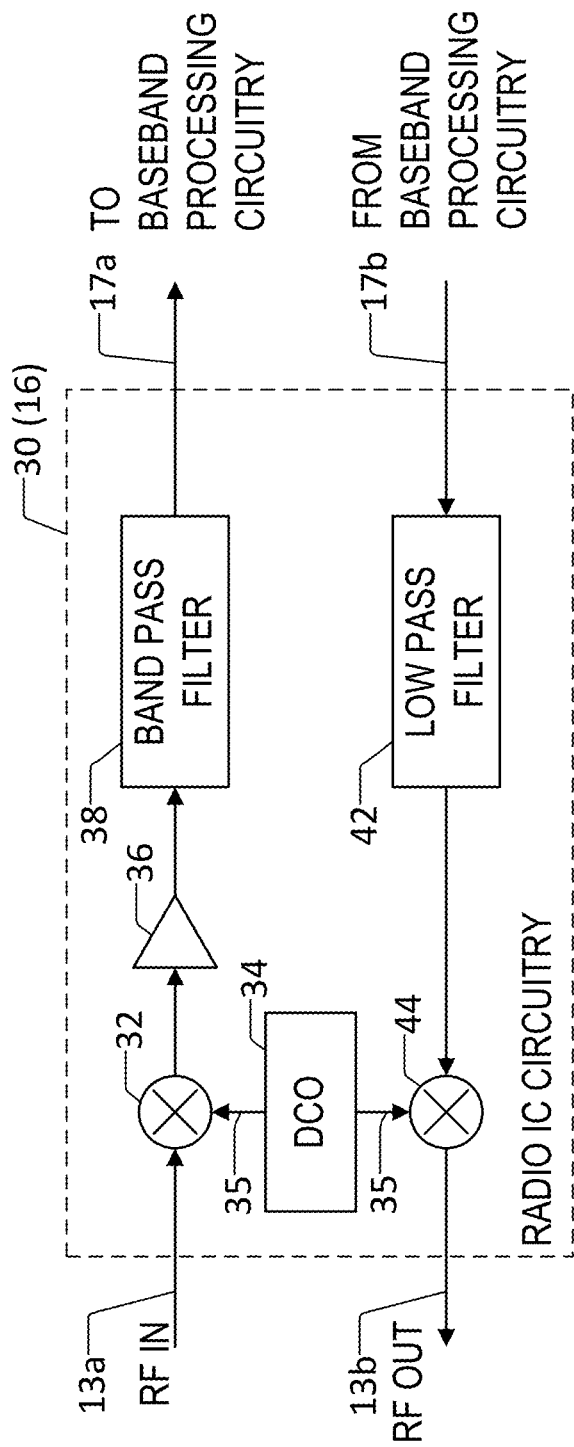
FIG. 1B is a block diagram that illustrates radio IC circuitry, in accordance with some aspects of the inventive subject matter.

FIG. 1B illustrates radio IC circuitry 30 in accordance with some configurations. The radio IC circuitry 30 is one example of circuitry that may be suitable for use as the radio IC circuitry 16 (FIG. 1A), although other circuitry configurations may also be suitable. In some configurations, the radio IC circuitry 30 may include a receive signal path and a transmit signal path. The receive signal path of the radio IC circuitry 30 may include at least mixer circuitry 32, amplifier circuitry 36 and filter circuitry 38. The transmit signal path of the radio IC circuitry 30 may include at least filter circuitry 42 and mixer circuitry 44. Radio IC circuitry 30 may also include the DCO as synthesizer circuitry 34 for synthesizing a frequency 35 for use by the mixer circuitry 32 and the mixer circuitry 44.

In some configurations, mixer circuitry 32 may be configured to down-convert RF signals 13a received from the front-end module circuitry 14 (FIG. 1A) based on the synthesized frequency 35 provided by the DCO 34. The amplifier circuitry 36 may be configured to amplify the down-converted signals and the filter circuitry 38 may be a band-pass filter (BPF) configured to remove unwanted signals from the down-converted signals to generate output baseband signals 17a. Output baseband signals 17a may be provided to the baseband processing circuitry 18 (FIG. 1A) for further processing. In some configurations, the output baseband signals 17a may be zero-frequency baseband signals, although this is not a requirement. In some configurations, mixer circuitry 32 may comprise passive mixers, although the scope of the configurations is not limited in this respect.

In some configurations, the mixer circuitry 44 may be configured to up-convert input baseband signals 17b based the synthesized frequency 35 provided by the synthesizer circuitry 34 to generate RF output signals 13b for the front-end module circuitry 14. The baseband signals 17b may be provided by the baseband processing circuitry 18 and may be filtered by filter circuitry 42. The filter circuitry 42 may include a low-pass filter (LPF), although the scope of the configurations is not limited in this respect.

In some configurations, the output baseband signals 17a and the input baseband signals 17b may be analog baseband signals, although the scope of the configurations is not limited in this respect. In some alternate configurations, the output baseband signals 17a and the input baseband signals 17b may be digital baseband signals. In these alternate configurations, the radio IC circuitry may include analog-to-digital converter (ADC) and digital-to-analog converter (DAC) circuitry. In some dual-mode configurations, a separate radio IC circuitry may be provided for processing signals for each spectrum, although the scope of the configurations is not limited in this respect.

FIG. 1C is a simplified schematic block diagram of a frequency-modulated DCO 100 and its main building blocks, in accordance with some aspects of the inventive subject matter. The frequency-modulated DCO 100 is one example of circuitry that may be suitable for use as the DCO circuitry 34 (FIG. 1B), although other circuitry configurations may also be suitable. The DCO 100 comprises an inductor Lo 105, a coarse-tuned (CT) capacitor bank 110, a negative Gm stage 115, a varactor matrix 120, and a buffer 130. A DCO oscillation frequency is determined by the inductor Lo 105 and a total capacitance accumulated in the capacitor bank 110 that make up an LC tank 107 and the varactor matrix 120. The negative Gm stage 115 recovers an energy of the lossy tank 107 and maintains oscillations, whereas the buffer 130 delivers a DCO differential signal 135 to external circuitry.

The CT capacitor bank 110 may be used for coarse DCO frequency tuning to a desired channel frequency. The varactor matrix 120, or FT matrix, may be used for fine adjustment of the DCO frequency. Additionally, the varactor matrix 120 may be employed to modulate the DCO frequency in order to realize a polar modulation. In order to accommodate the large bandwidth needed for polar modulation, and in order to keep the quantization error in an acceptable range, the size of the varactor matrix may be very large, and usually more than 1024 varactors, such as the unity cell varactor 150, are needed.

The varactor matrix 120 is a thermo coded matrix of unity cells having a capacitance value of $C_{var}$, and the CT capacitor bank has a capacitance value of $C_0$. A tuning code is input to turn various unit cells on and off. The oscillation frequency f may be given by the equation:

$$2\pi f = 1/\sqrt{L(C_0 + C_{var})}$$

Figure 1E:
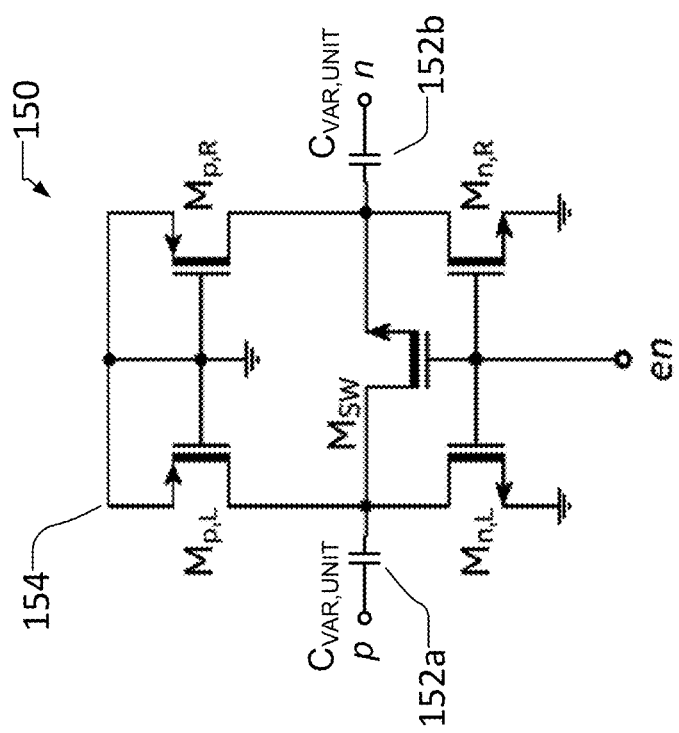
FIG. 1E is a schematic diagram of a unity cell varactor with switch circuitry, in accordance with some aspects of the inventive subject matter.

FIG. 1D is a schematic of an example of a unity cell varactor 150 that may be used in the varactor matrix 120, in accordance with some aspects of the inventive subject matter. Each varactor 150 may comprise two differential capacitors 152a, 152b and a switch 154 in between, as shown in FIG. 1B. Building an efficient varactor structure in terms of size and performance benefits the entire frequency-modulated DCO 100. FIG. 1E is a schematic diagram of a unity cell varactor showing an example of the switch circuitry, in accordance with some aspects of the inventive subject matter. The varactor switch 154 is represented, by way of example only, in the following FIGS. by switches 200a, 200b, 400, 500, 600a-600e, 700A-700c, 800a, and 800b.

FIGS. 2A-2C are schematic diagrams of related art switches used to turn on and turn off a capacitor, either for coarse tuning or fine tuning of the capacitor bank 110. The different structures are analyzed in the following. FIG. 2A is a schematic diagram of a resistor-biased switch 200a, where Msw 205a is the main switch and Rb,L 210a1 and Rb,R 210a2 (collectively or representatively 210a—in general, reference characters for similar elements may be shortened below as has been done here) are auxiliary bias resistors. Typically, Msw 205a may be implemented as a large MOS device, which provides low on-resistance, whereas the bias resistors 210a are high-ohmic to preserve the LC tank 107 quality factor. The structure is controlled with two inverters 215a1, 215a2, the first inverter 215a1 providing a potential for the auxiliary resistors 210a, and the second inverter 215a2 controlling the switching MOS device 205a.

In an ON-state, the gate of the MOS switch Msw 205a is pulled to VDD, while the drain and source are tight to ground via the auxiliary resistors Rb,L 210a1, Rb,R 210a2 such that the channel resistance is minimized. In an OFF-state, the gate of the MOS switch Msw 205a is tight to ground, while the drain and source are connected to VDD via the auxiliary resistors Rb,L 210a1, Rb,R 210a2 in order to minimize the parasitic capacitance of the switch. The structure may be employed in DCO/VCO coarse tuning banks.

A disadvantage of this design is that the high-ohmic resistor consumes large area in silicon. The large physical size prohibits their use in varactor matrices. If the resistors are made smaller such that they fit the available area, they load the LC tank, and thus will deteriorate the DCO noise performance.

FIG. 2B is a schematic diagram of a CMOS-based switch 200b in which the bias resistors Rb,L 210a1, Rb,R 210a2 from FIG. 2A are replaced with a small (typically minimum-sized) MOS devices. The operation of the switch is very similar to that of FIG. 2A, with the difference being that now the PMOS devices Mp,L 210b1 and Mp,R 210b2 realize the high impedance to VDD instead of the resistors. The transistor Msw 205b, has the same functionality described above, and the transistors Mn,L 220b1, and Mn,R 220b2 have a functionality described below. The ratio between the on-state and off-state switch resistance is determined mainly by the different size ratios between main switch Msw 205b and the PMOS switches Mp,L 210b1 and Mp,R 210b2.

The disadvantages of this design are that, for the purpose of a DCO varactor matrix, where each varactor units switches on and off a small unity capacitor (in the sub-ff range), this type of switch is not convenient. The main switch is typically a minimum sized device, or close to its minimum, and thus the PMOS switches Mp,L 210b1 and Mp,R 210b2 have a similar resistance to Msw 205b. The small ratio between on and off resistance implies that the capacitor switching effectiveness would be low.

In order to make the resistance of the PMOS devices Mp,L 210b1 and Mp,R 210b2 higher (i.e., to increase the switching effectiveness), their channel length has to be increased while minimizing the channel width. As a consequence, the occupied silicon area increases, and furthermore, this adds extra parasitic capacitance to the main switch. Both effects are not desired and they will degrade the performance of the varactor matrix.

FIG. 2C is a schematic diagram of an NMOS-only switch 200c, which is a variation of the two previous switch configurations shown in FIGS. 2A, 2B. The structure avoids the bias resistors Rb,L 210a and Rb,R 210b in FIG. 2A, and the bias PMOS devices Mp,L 210b1 and Mp,R 210b2 in FIG. 2B, which are prohibitive for varactor matrix integration. The NMOS-only switch 200c can be easily incorporated into a varactor matrix due to its small size.

The switch operation during the on-state is similar to the previous switches—the gate of the switch Msw 205c is pulled to VDD, while its drain and source are tight to ground via Mn,L 220c1 and Mn,R 220c2. In the off-state, the three NMOS devices are disabled, which ideally provides very high switch resistance. Due to this fact, the direct current (DC) voltage potential at the source/drain of three NMOS devices is determined by the outside circuitry, or by second-order transistor effects.

In the particular case of a switched capacitor, the RF amplitude imposed to the p and n terminals of the off-state switch, together with the MOS threshold voltage and body bias diode, determine the settled value of DC potential. The NMOS devices Mn,L 220c1 and Mn,R 220c2 and their associated body diode opens at the negative voltage peaks, which causes a current spike to be injected into the capacitors, which in turn shifts up the DC bias voltage. The DC voltage shift is a function of both RF amplitude and MOS technology parameters (threshold voltage and diode parameters).

Figure 3B:
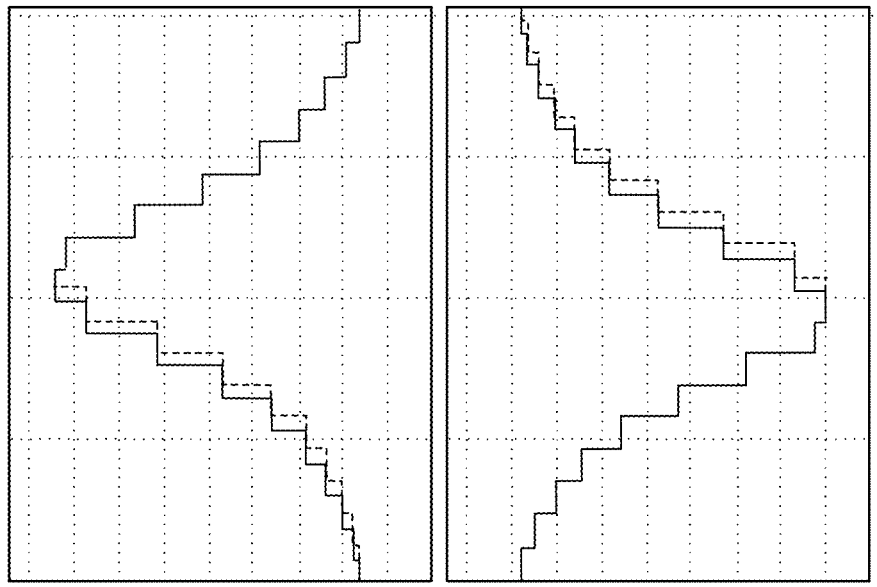
FIG. 3B is pair of graphs that illustrate the signal distortion from asymmetric delay
Figure 3A:
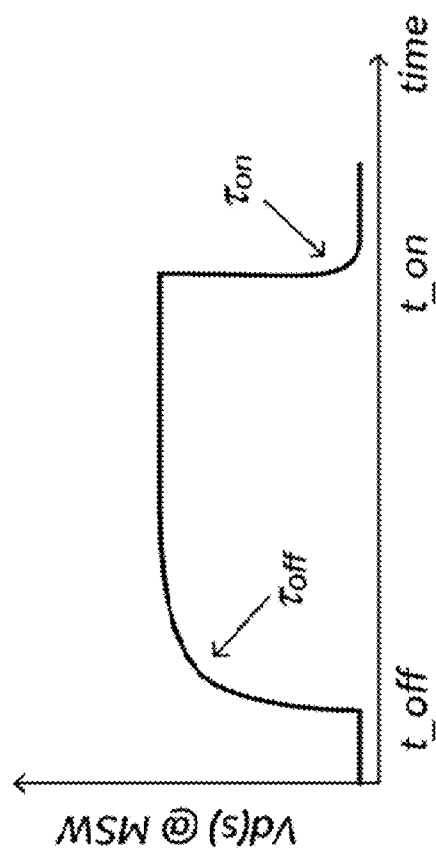
FIG. 3A is a time-based graph of a simplified voltage transient inside of a varactor cell.

FIG. 3A is a time-based graph of a simplified voltage transient inside of a varactor cell (only the DC component is shown) that illustrates the disadvantages of this design, namely, the asymmetrical delay in that there is a large time constant when turning off the switch. FIG. 3A plots an example transient process when turning off and turning on the switch (not to scale). The time constant associated with the turn-on process ($\tau_{on}$) is determined by the small on-resistance of the switches and the switched capacitor. The time constant associated with the turn-off process ($\tau_{off}$) is determined by the off-resistance of the switches and the switched capacitor, which is much larger than $T_{on}$ due to the large impedance of the switched off NMOS devices.

As the voltage at the drain and at source of the switch Msw 205c increases during the transient process, the impedance of the switch further increases, making the settling process very slow. The DCO frequency follows this transient process—the generated frequency exhibits a very slow drift, typically in the microsecond-range. This particular drift causes an unsymmetrical DCO modulation, which results in high EVM. Furthermore, the large time constant associated with the switch is very sensitive to process tolerances and temperature variations. Digital techniques to overcome this limitation should have process and temperature dependent coefficients, which increases implementation complexity.

FIG. 3B is pair of graphs that illustrate the signal distortion from asymmetric delay that distorts the FM signal, where frequency pulses become shorter or longer depending on the polarity of the frequency pulse. Phase error has same polarity in both cases. Common delay (on rising and falling edges) does not cause non-linear distortion.

The uppermost graph illustrates a rising frequency on its left half, and a falling frequency on its right half. The solid line illustrates the original signal, and the dashed line illustrates the distorted signal. The lowermost graph illustrates a falling frequency on its left half, and a rising frequency on its right. For a rising and falling frequency, the varactor cells are switched on and off with a different delay $t_{del}$. Non-linear distortion arises from delay asymmetry $\Delta t_{del}$ where:

$$\Delta t_{del} = t_{del,rise} - t_{del,fall}$$

The highest distortion occurs at short frequency pulses with large frequency deviation that are needed for wideband signals. Calculation of an effective delay may be done from an integrated frequency error/phase error. For a single frequency step at t=0 from an initial frequency $f_1$ to a final frequency $f_2$, the effective delay $t_{del}$ can be calculated from the instantaneous frequency f(t) as:

$$t_{del} = \int u(t) - \frac{f(t) - f_1}{f_2 - f_1} dt$$

where u(t)=a unity step function.

Figure 4A:
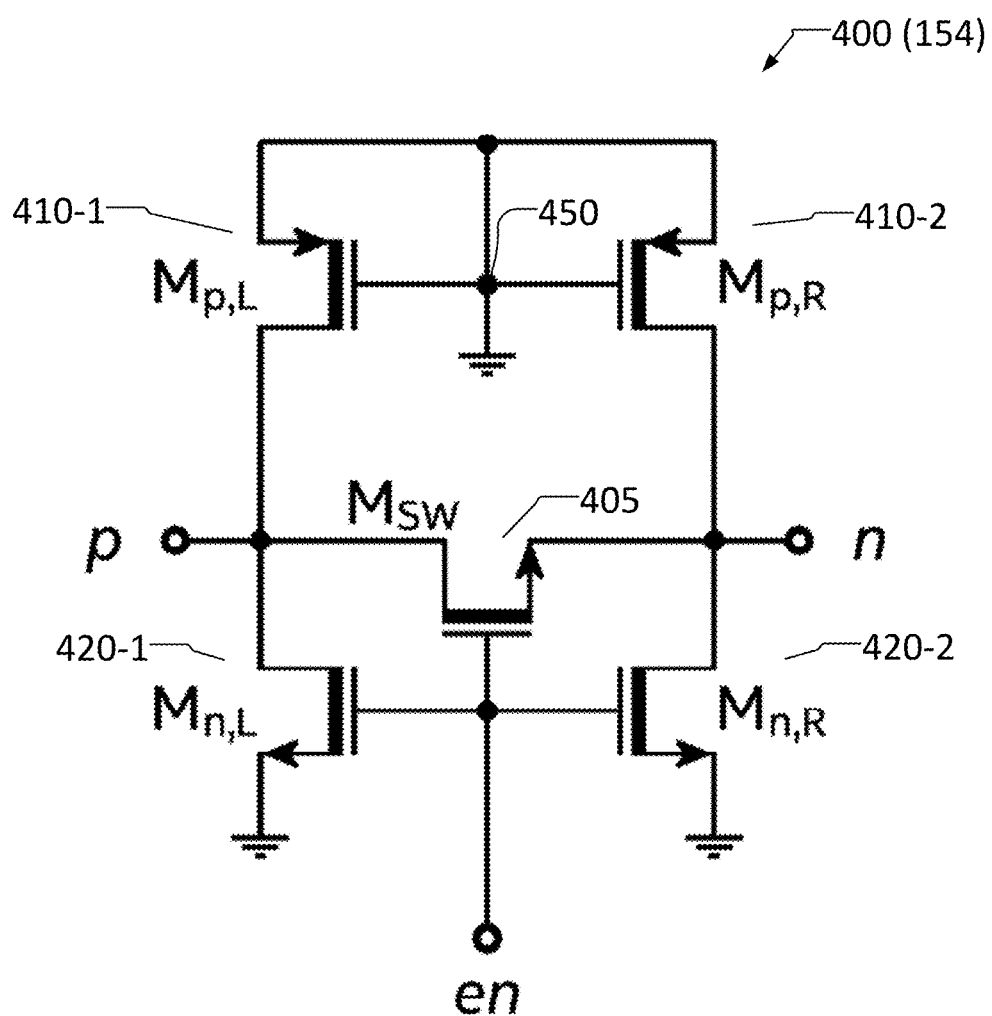
FIG. 4A is a schematic diagram of a switch design according to a first switch configuration, in accordance with some aspects of the inventive subject matter.

FIG. 4A is a schematic diagram of a switch design according to a first switch configuration, in accordance with some aspects of the inventive subject matter. This design constitutes an NMOS switch 400 with a PMOS grounded bias, which is a new varactor switch configuration that overcomes the shortcoming of the state-of-the-art switches (outlined above). The varactor switch 400 uses PMOS grounded devices Mp,L 410-1, Mp,R 410-2 to provide a finite impedance to the switched off NMOS devices Mn,L 420-1, Mn,R 420-2. In addition, the PMOS devices Mp,L 410-1, Mp,R 410-2 set the DC voltage to zero at the p (first) and n (second) terminals in the off-state, which avoids any transient behavior when alternating switch states. The PMOS devices 410 may have their gates joined at a common PMOS junction 450 which is grounded. The sources of the PMOS devices 410 may also be connected to the grounded common PMOS junction 450. The gates of the PMOS devices 410 may be connected to the first and second terminals.

Figure 4B:
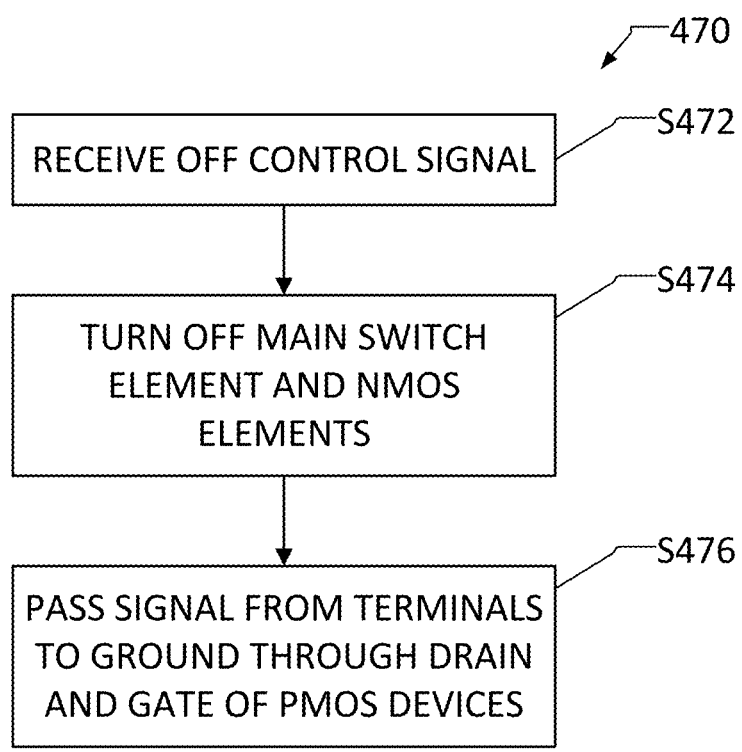
FIG. 4B is a flowchart illustrating operation of a switch design, in accordance with some aspects of the inventive subject matter.

FIG. 4B is a flowchart illustrating operation of, for example, the switch 400. When the switch 400 receives an off control signal S472, for example, by providing 0V at the control terminal, the main switch device MSW 405 and the NMOS devices Mn 420 are turned off S474. Based on the configuration of the PMOS devices 410, a signal path may be provided S476 between each terminal p, n and ground through a drain and gate of a respective PMOS device 410 which provides a finite impedance and predefined DC voltage in the off-state. By providing a finite impedance and predefined DC voltage in the off-state, the switching transient limitation of the NMOS-only switch (FIG. 2C) is avoided. Furthermore, this topology is an improved switch compared to the CMOS switch (FIG. 2B), since much higher resistance can be obtained from the PMOS devices Mp,L 410-1, Mp,R 410-2, as drain and source potentials are near ground. The circuit modification takes advantage of the MOS body-bias effect, which effectively reduces the device overdrive, and therefore it increases the channel resistance. This effect allows use of minimum-sized PMOS devices, which enables varactor matrix integration with an acceptable area overhead. Furthermore, the minimum-sized PMOS device contributes small parasitic capacitance, which can be tolerated.

One potential limitation of the switch 400 is an operation with a large DCO voltage swing. The DCO voltage swing is scaled down to the switching devices, but if the internal swing is sufficiently high, then the impedance of the PMOS device can reduce significantly. The reduced impedance could cause quality factor degradation and loss of phase noise performance. Since the internal swing depends also on the Cmax/Cmin ratio of the unity varactor cell, this potential issue can be avoided by proper varactor design and appropriate DCO swing control.

Figure 5:
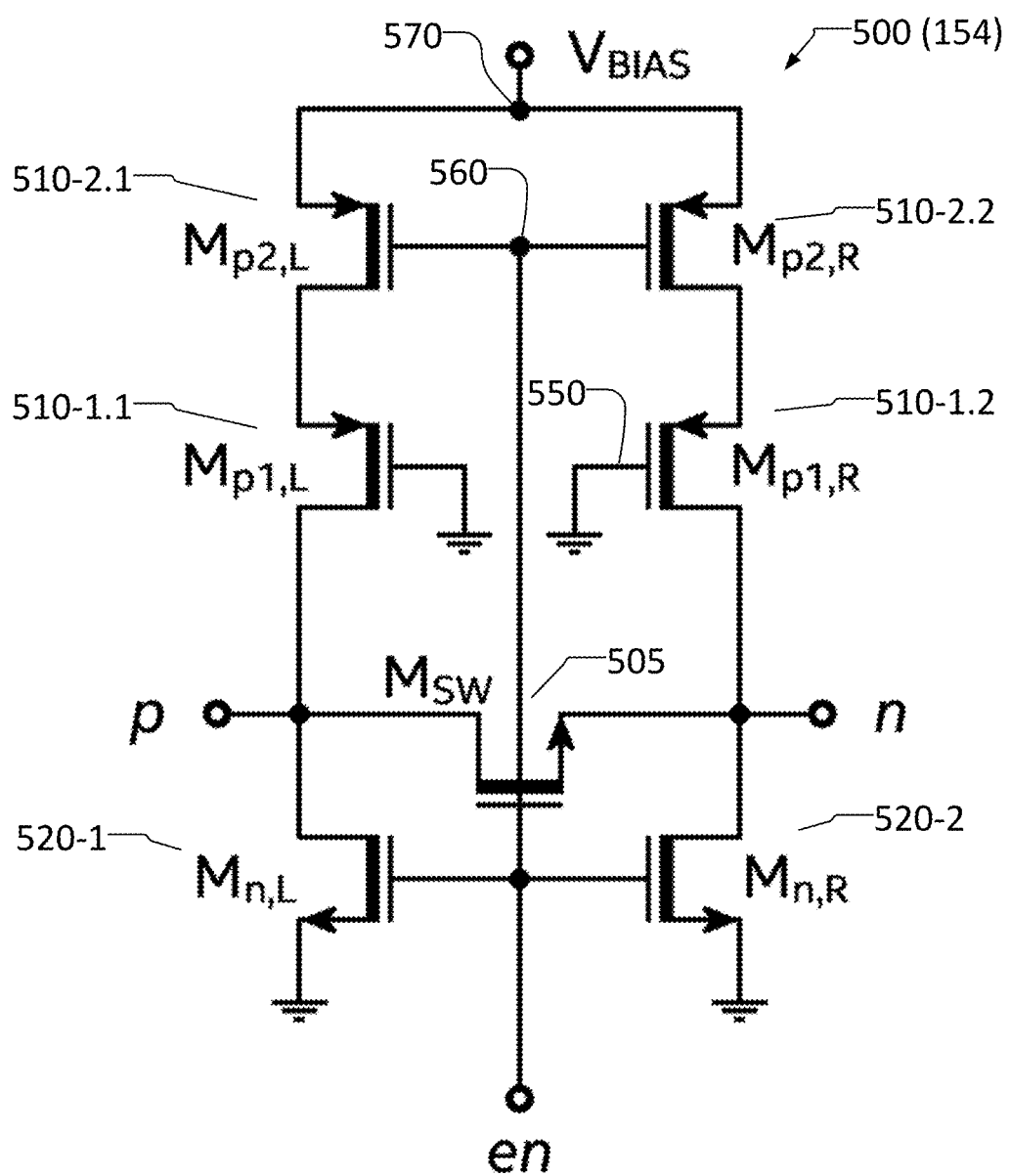
FIG. 5 is a schematic diagram of a switch design according to a second switch configuration, in accordance with some aspects of the inventive subject matter.

FIG. 5 is a schematic diagram of a switch design according to a second switch configuration, in accordance with some aspects of the inventive subject matter. This design constitutes an NMOS switch 500 with stacked PMOS device and programmable bias. This is a further improved varactor switch 500 compared to the switch 400 in FIG. 4. The PMOS grounded transistors Mp,L 410-1, Mp,R 410-2 in FIG. 4 are replaced with stacked PMOS devices Mp1,L 510-1.1, Mp2,L 510-2.1, Mp1,R 510-1.2, Mp2,R 510-2.2. The gates of the first PMOS devices (Mp1,L 510-1.1 and Mp1,R 510-1.2) are connected at a common first PMOS junction 550 to ground to provide a high impedance in the switch turn-off state. The gates of the second PMOS devices (Mp2,L 510-2.1 and Mp2,R 510-2.2) are connected to a common second PMOS junction 560 to an enable signal (en) at the gate of the main switch Msw 505. Furthermore, the sources of the transistors Mp2,L 510-2.1 and Mp2,R 510-2.2 are connected to a common third PMOS junction 570 at an auxiliary programmable voltage (Vbias), which provides additional flexibility and functionality. The two stacked PMOS devices offer higher resistance compared to a single PMOS device, and thus this design allows for a reduction in transistor size, if needed.

Figures 6A, 6B:
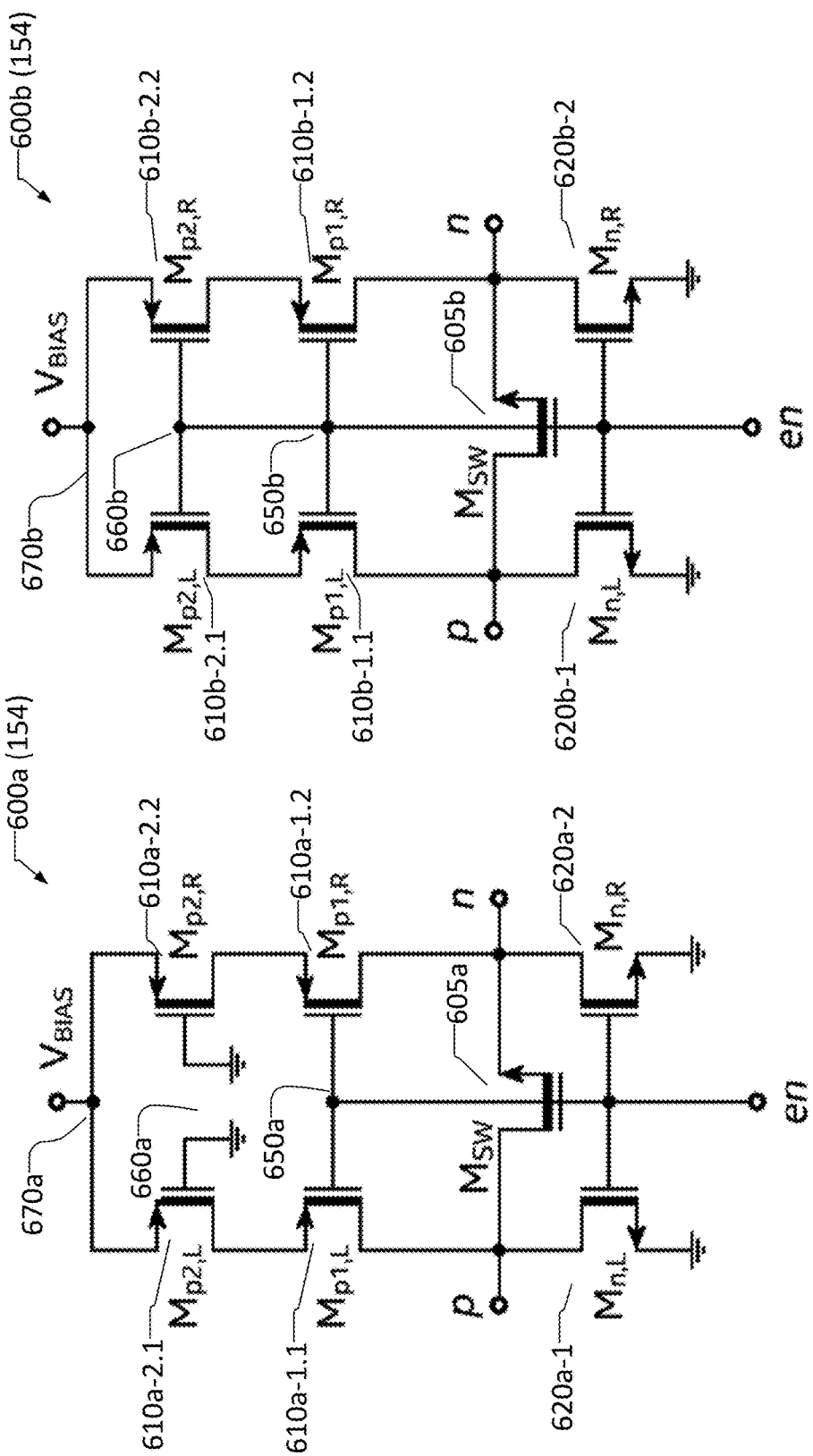
FIGS. 6A-6E are schematic diagrams of switch designs according to further switch configurations, in accordance with some aspects of the inventive subject matter.

FIG. 6A is a schematic diagram of a switch design according to a further switch configuration, in accordance with some aspects of the inventive subject matter, using an alternative and equivalent switch topology that can be built by exchanging the configuration of the Mp1 510-1 and Mp2 510-2 transistors from that in FIG. 5. That is, in FIG. 6A, the gates of the transistors Mp1,L 610a-1.1 and Mp1,R 610a-1.2 are connected to a common first PMOS first junction 650a that is connected to the enable signal (en), and the gates of Mp2,L 610a-2.1 and Mp2R 610a-2.2 are connected to ground.

FIG. 6B is a schematic diagram of a second alternative configuration of the FIG. 6A design, in accordance with some aspects of the inventive subject matter, that connects the gates of all PMOS devices 610b to a common first 605b and second 660b PMOS junction point connected to the enable signal en, given that the preceding driver is properly designed to take the additional capacitive loading. The additional capacitive loading could be seen as increased current consumption from the driver during polar modulation. If all PMOS device gates were to be connected to ground instead of the enable signal, as shown (e.g., to reduce current consumption), then there could be a current leakage from Vbias towards ground when the switch is in the ON state. This current leakage is undesired, and is a function of Vbias and process variations.

Figures 6C, 6D, 6E:
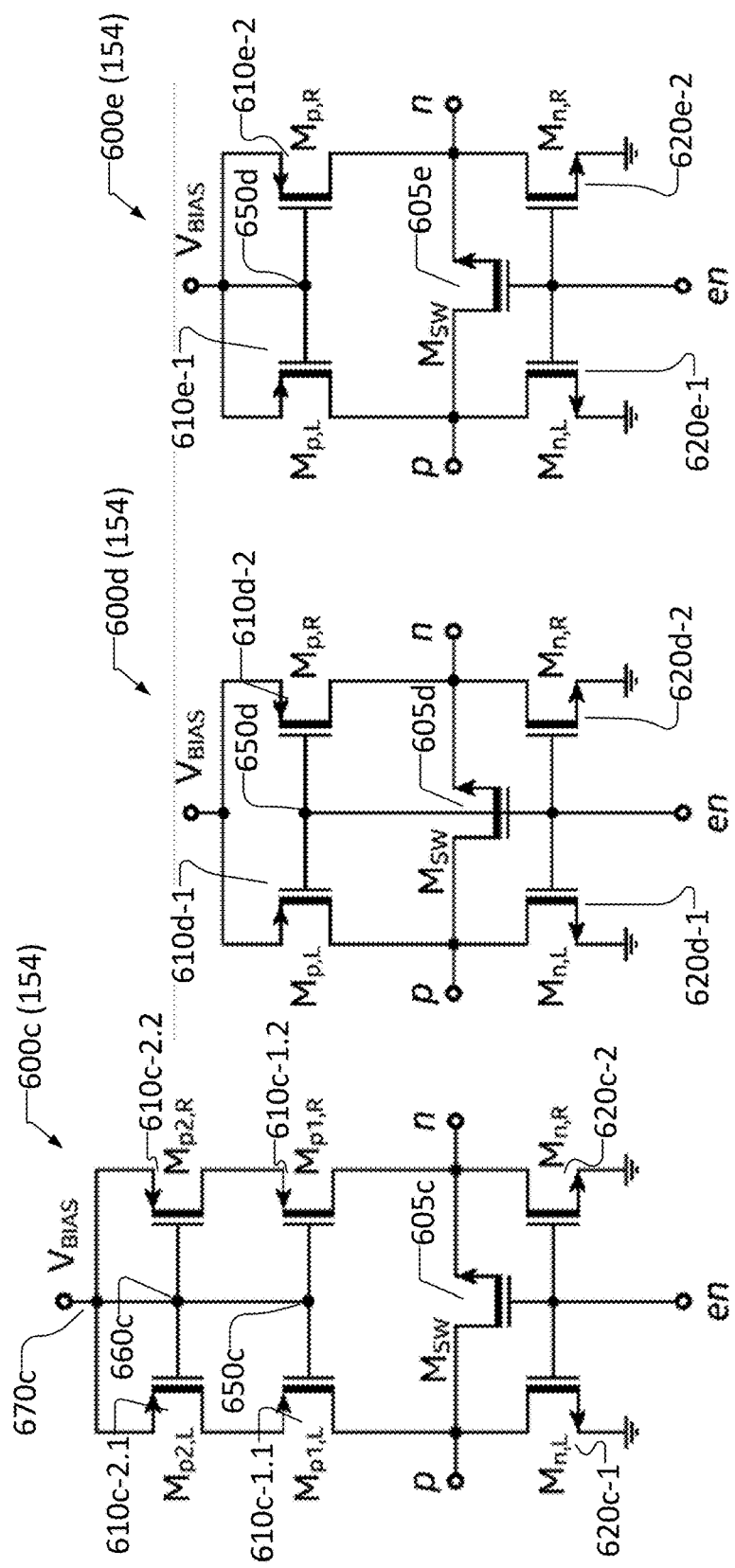

FIG. 6C is a schematic diagram of a third alternative configuration of the FIG. 6A design, in accordance with some aspects of the inventive subject matter, that connects the gates of all PMOS devices 610c a common first 650c and second 660c junction that is connected to Vbias, given that the voltage Vbias is set to a value which provides a high PMOS impedance. FIG. 6D is a schematic diagram of a fourth alternative configuration of the FIG. 6A design that combines the stacked PMOS devices 610b, 610c from FIG. 6B and FIG. 6C into one PMOS device 610d, as shown in FIG. 6D, with an appropriate size modification to achieve equivalency. FIG. 6E is a schematic diagram of a fifth alternate configuration of the FIG. 6A design that is similar to the configuration shown in FIG. 6D, but with the gate of the PMOS devices 610e connected via a common junction 650d to Vbias.

Figures 7A, 7B:
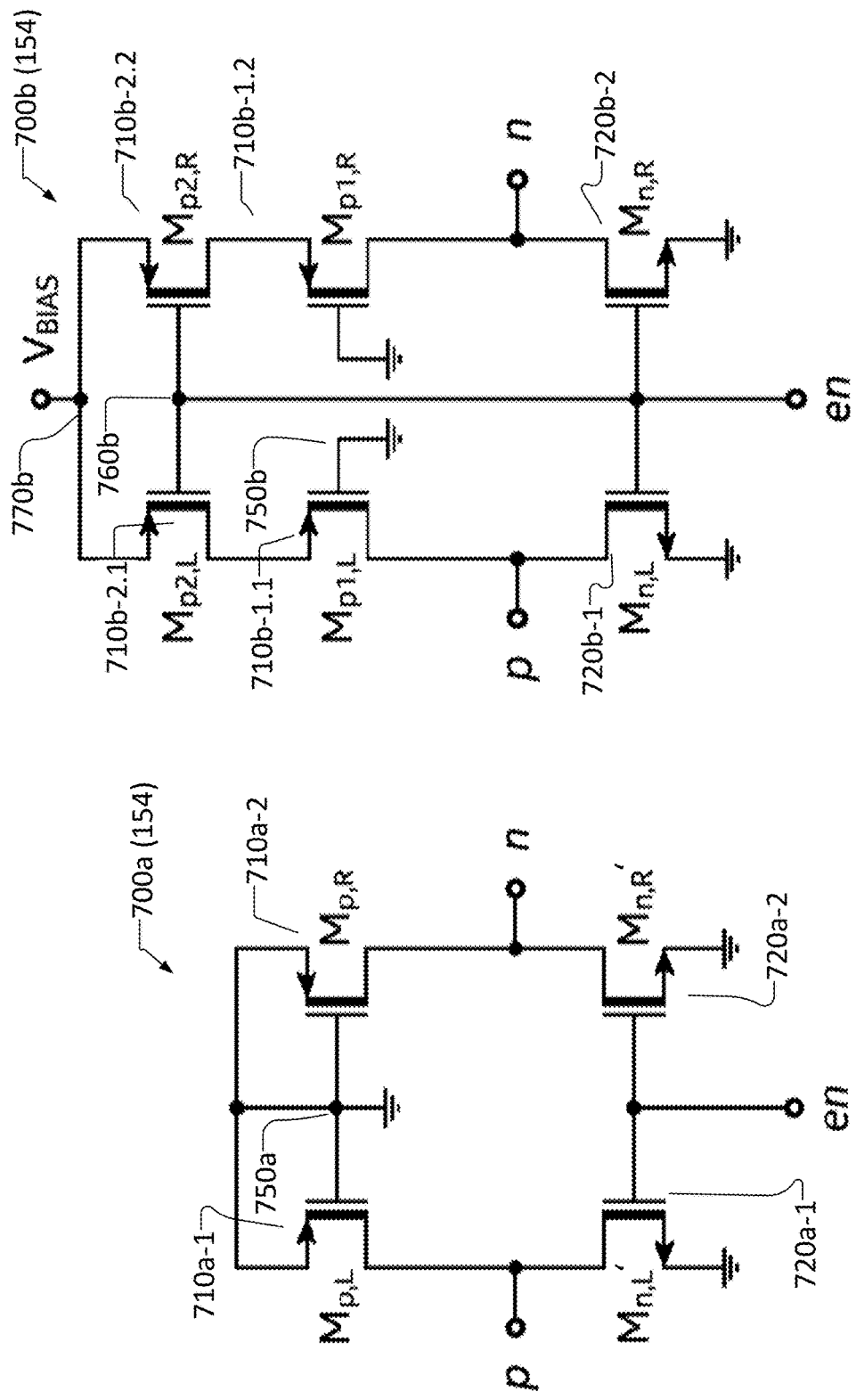
FIGS. 7A-7C are schematic diagrams of switch designs according to further switch configurations, in accordance with some aspects of the inventive subject matter.
Figure 7C:
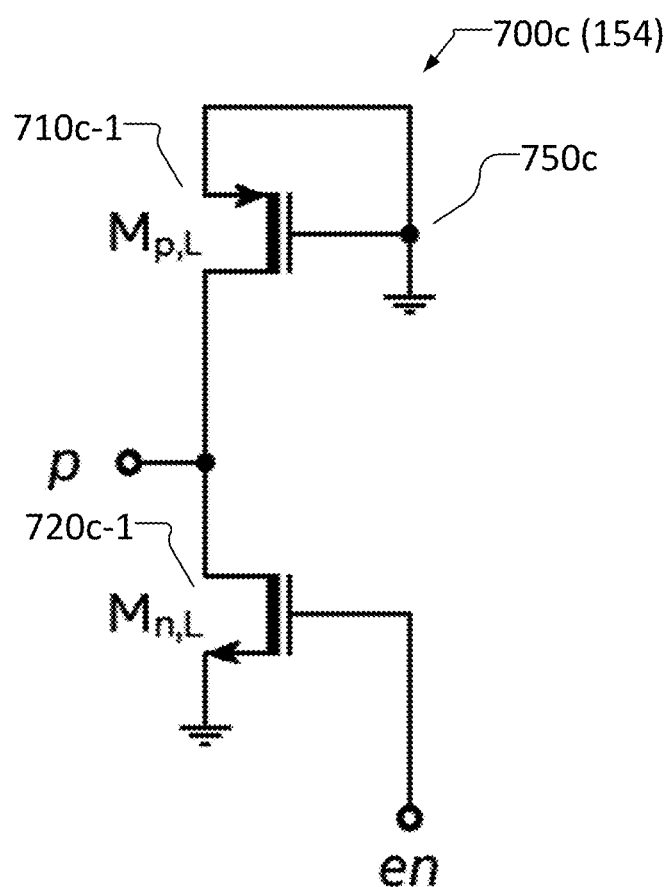

FIG. 7A is a schematic design according to a further switch configuration, using an alternative switch configuration with single-ended NMOS switches, in accordance with some aspects of the inventive subject matter. This design presents a switch topology in which the differentially-connected transistor Msw may be replaced with two single-ended transistors Msw1 and Msw2 (not shown). The two single-ended transistors Msw1 and Msw2 could be further combined with the auxiliary transistors Mn,L and Mn,R shown in prior figures, and Mn,L' 720a-1 and Mn,R' 720a-2 represent Msw1 in parallel with Mn,L and Msw2 in parallel with Mn,R, respectively. FIG. 7A provides an example realization of the switch topology from FIG. 4, and FIG. 7B provides an example realization of the switch topology from FIG. 5. The size of the transistors Mn,L' 720-1 and Mn,R' 720-2 should be larger than Mn,L and Mn,R in order to achieve identical switch performance. FIG. 7C is a schematic diagram that shows a pure single-ended switch topology, which follows the same concept and which can be utilized in single-ended VCO/DCO architectures.

The design is not limited to switch topologies in which the NMOS device provides a low ON-state impedance and the PMOS device provides a high OFF-state impedance. The design includes topologies in which the PMOS device provides a low ON-state impedance and the NMOS device provides a high OFF state impedance.

Figures 8A, 8B:
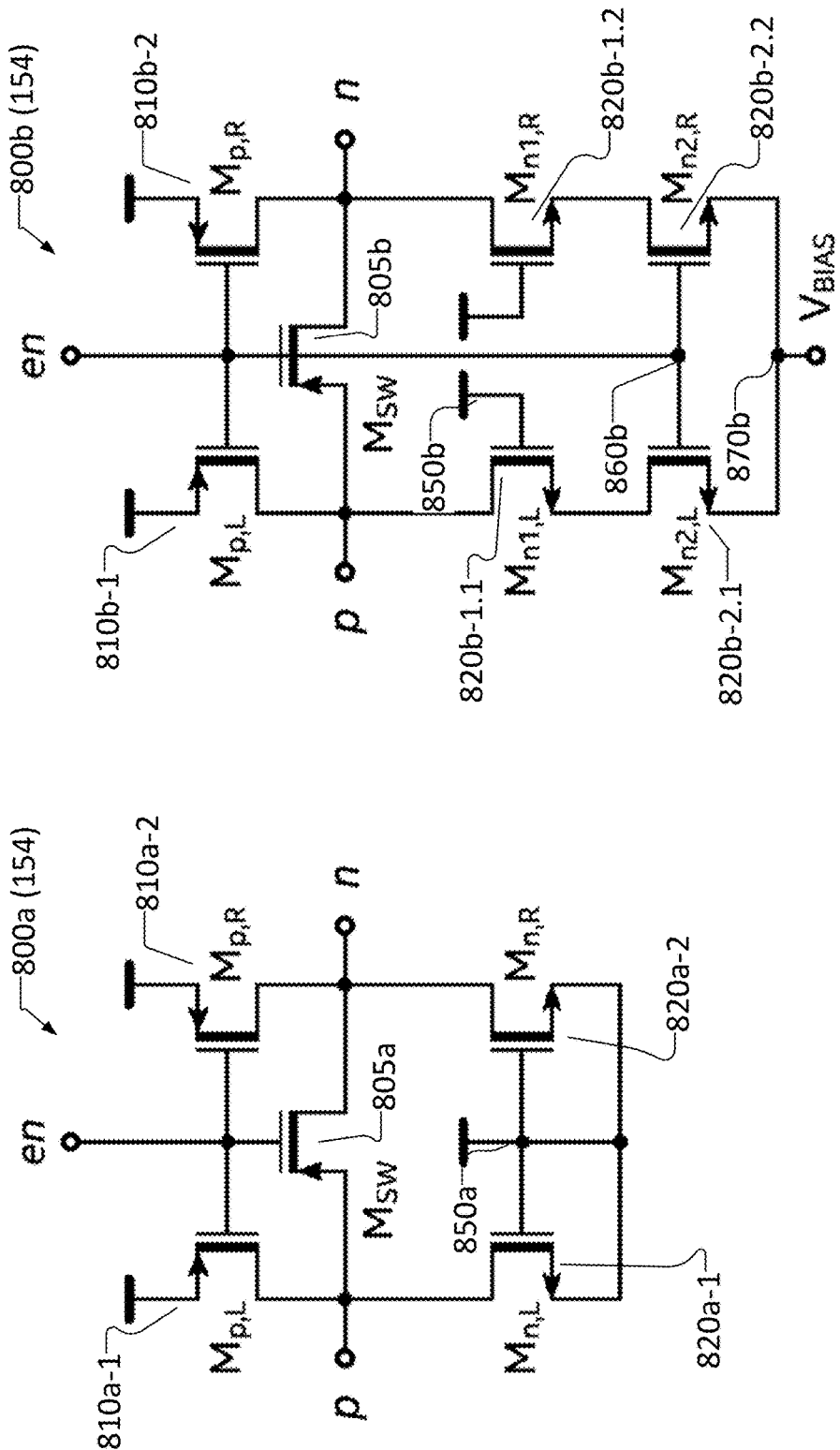
FIGS. 8A-8B are schematic diagrams of switch designs according to further switch configurations, in accordance with some aspects of the inventive subject matter.

FIGS. 8A and 8B are schematic designs according to a further switch configuration, in accordance with some aspects of the inventive subject matter, using an alternative switch configuration with exchanged NMOS 820 and PMOS 810 devices relative to the switch 805. As an example realization of such topologies, FIGS. 8A and 8B reproduce the general switch topologies from FIG. 4 and FIG. 5 respectively. In these example realizations, NMOS 420, 520 devices are structurally replaced with PMOS devices 810, ground is replaced with VDD, the enable signal has opposite polarities, the PMOS devices 410, 510 are structurally replaced with NMOS devices 820 that are joined at an NMOS common junction 850a, (or common junctions 850b, 860b, 870b), etc. While the principle of operation of these alternative switches is similar to the original ones, their implementation may benefit process nodes having better PMOS devices than NMOS devices.

One potential advantage of the above-discussed switch topologies may be demonstrated via analog simulations of a DCO transient behavior. For the purpose of this demonstration/evaluation, varactors are turned on and turned off in a step-like fashion, and then the settling behavior of the DCO frequency is observed. For this comparison, the two proposed topologies shown in FIGS. 4 and 5 are compared against the state-of-the-art NMOS-only switch (shown in FIG. 2C). The other two state-of-the-art topologies (shown in FIGS. 2A and 2B) are intentionally not included in this evaluation, since, as stated above, they cannot be implemented in reasonable manner inside a DCO varactor matrix.

Figure 9:
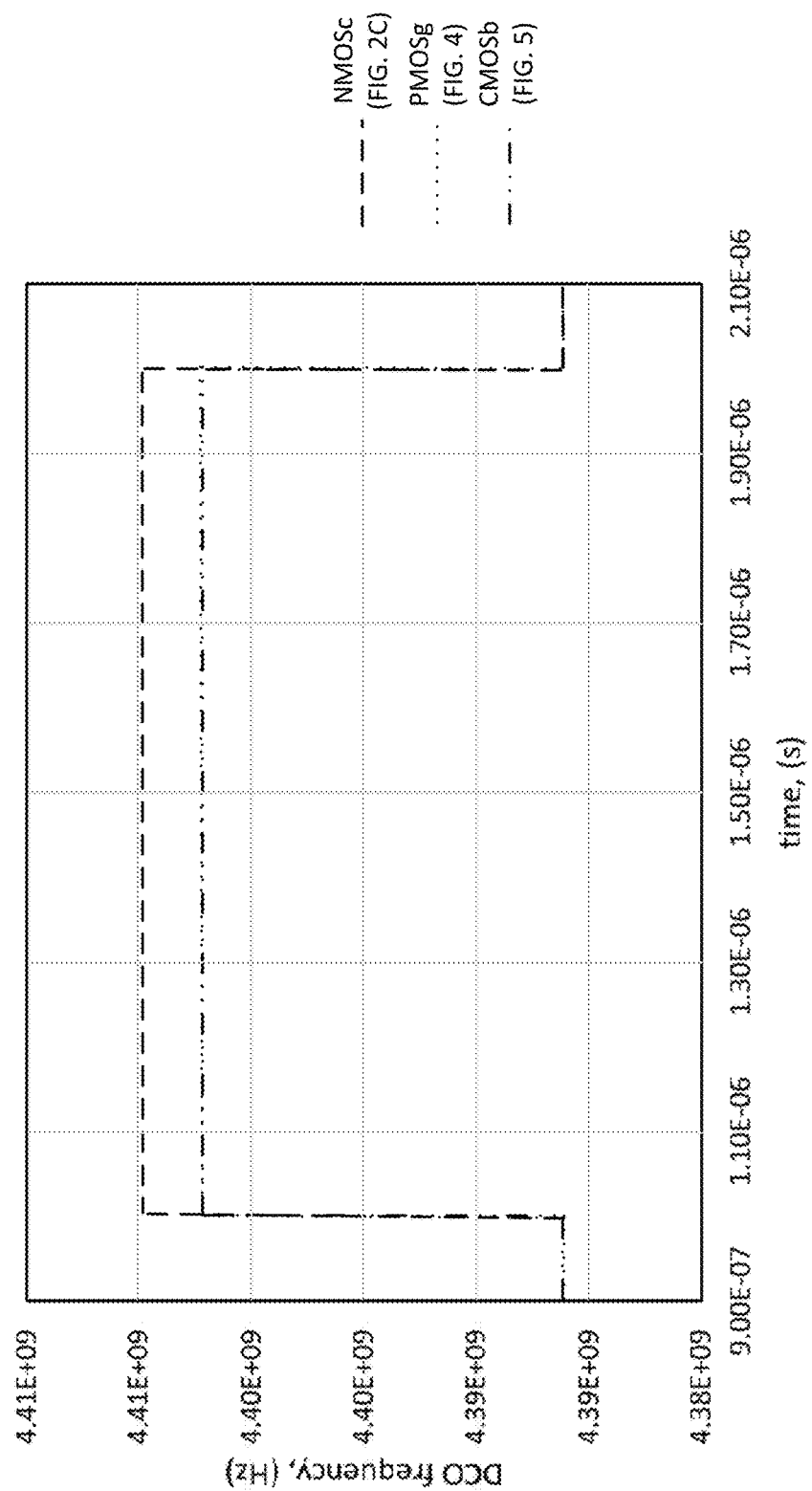
FIG. 9 is a graph that shows a frequency settling behavior of an example of a DCO having three different varactor switch topologies, in accordance with some aspects of the inventive subject matter.

FIG. 9 is a graph, in accordance with some aspects of the inventive subject matter, that shows a frequency settling behavior of an example of a DCO 100 having three different varactor switch 154 topologies: NMOS-only switch 200c (FIG. 2C), PMOS grounded switch 400 (FIG. 4), and CMOS biased switch 500 (FIG. 5). To obtain a fair comparison, all DCO building blocks, except the varactor switch, remain unchanged. Also, the unity-cell varactor capacitors 152a, 152b remain unchanged. As shown in the FIG. 9, the varactor units are turned off at time ~1 us, and then turned on again at time ~2 us. The DCO frequency in the varactor turned-on state is the same for three switch topologies, since it is governed by the value of the unity-cell capacitors. On the other hand, the DCO frequency in the varactor turned-off state is different, because of the different parasitic capacitance of the switch topologies. The smallest parasitic capacitance is introduced by the NMOS-only switch topology, and thus the DCO frequency is the highest. In order to evaluate the DCO frequency drift, the transient process of the DCO frequency is normalized to the respective frequency step, and then the switch topologies are compared against each other.

Figure 10:
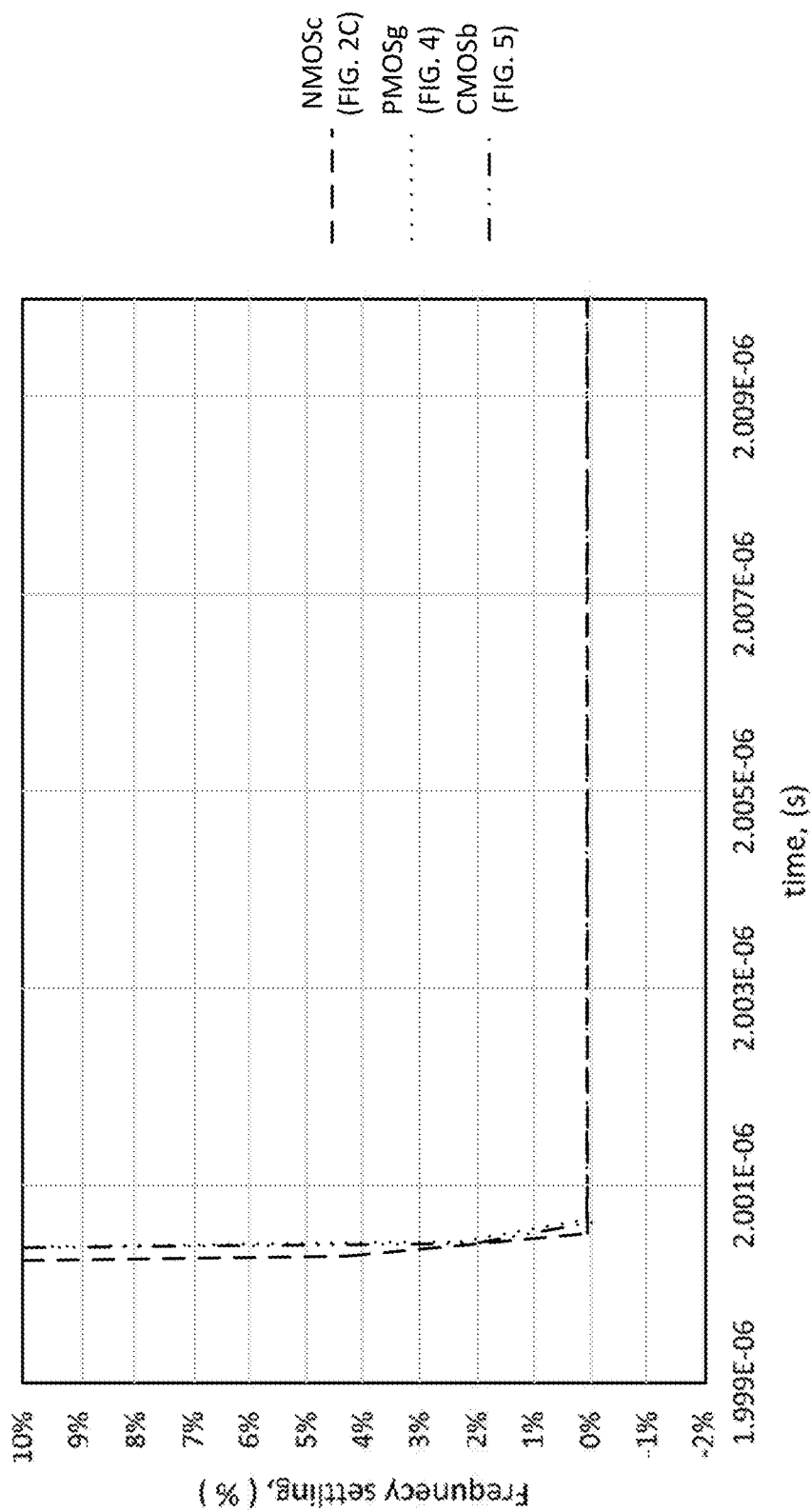
FIG. 10 is a graph showing frequency settling in relative units to make it independent from number/size of unity tuning caps, in accordance with some aspects of the inventive subject matter.

FIG. 10 is a graph, in accordance with some aspects of the inventive subject matter, showing the DCO frequency transient when turning on the varactors. It shows that the turn-on process is almost instantaneous for the three switch topologies. This is due to the fact that the on-resistances of three switches are comparable, and thus they form similar time constant $\tau_{on}$.

Figure 11:
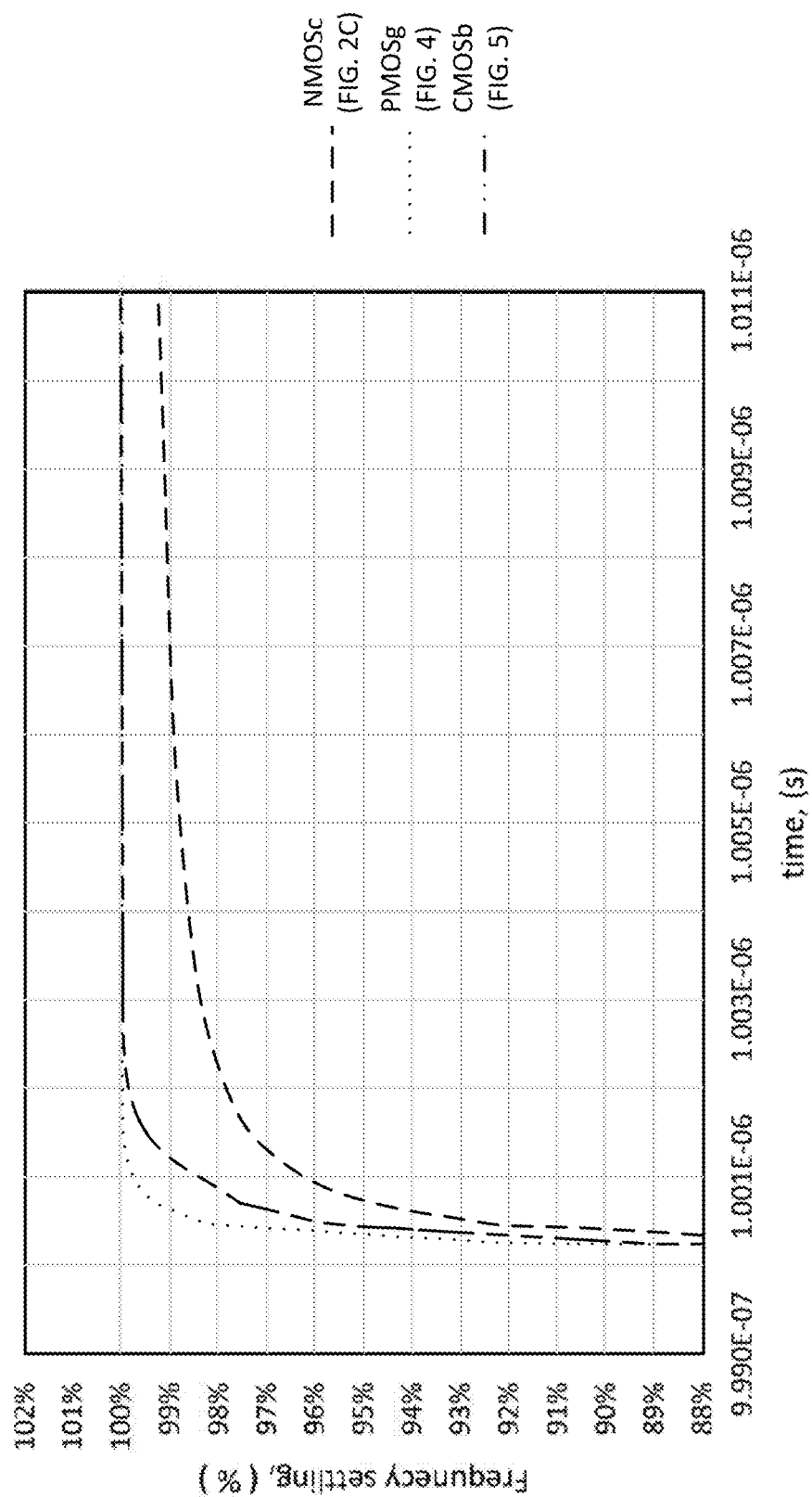
FIG. 11 is a zoomed-in graph showing the DCO frequency transient when turning off varactors, in accordance with some aspects of the inventive subject matter.
Figure 12:
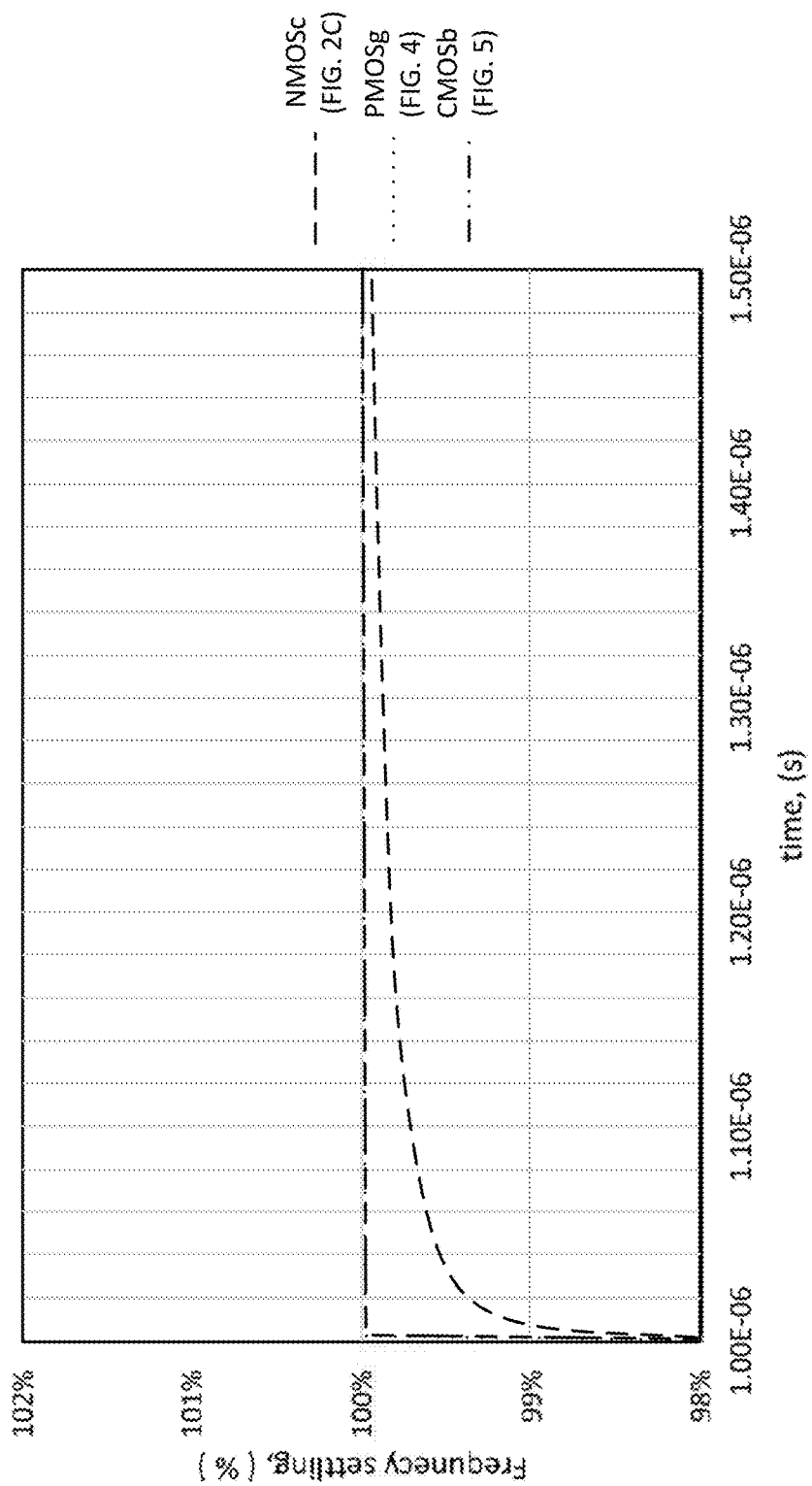
FIG. 12 is a zoomed-out graph showing the DCO frequency transient when turning off varactors, in accordance with some aspects of the inventive subject matter.

FIG. 11 is a zoomed in graph, in accordance with some aspects of the inventive subject matter, showing the DCO frequency transient when turning off varactors. It shows the turn-off process, where the time constant $\tau_{off}$ is visibly larger than $\tau_{on}$, which is governed by the much larger switch resistance with the same unity capacitor. Nevertheless, the DCO frequency for the disclosed varactor switches 400, 500 settles to its final (100% value) in few DCO cycles. On the other hand, the state-of-the-art switch topology 200c needs much longer time to settle. The final 1% settling could require even more than 1 us (>1000 DCO cycles), as shown in FIG. 12, which is a zoomed out graph, in accordance with some aspects of the inventive subject matter, showing the DCO frequency transient when turning off varactors, as shown in FIG. 11. This long settling time is typically not a concern for a synthesizer-based phase-locked loop (PLL) operation, since the PLL feedback can correct such a frequency drift. However, in frequency modulated DCO, this slow frequency drift causes a modulation distortion, which results in EVM degradation.

Various of these new designs may be tailored for large varactor matrices, and thus their small size enables straightforward physical implementation (which is advantageous compared to the resistor-biased switch 200a). Furthermore, various disclosed switch topologies may provide a high off-state resistance, which makes for effective capacitance switching (which is advantageous compared to the CMOS switch 200b). In addition, the high off-state resistance helps to preserve the quality factor of the loaded LC tank 107, and thus it does not degrade the DCO phase noise. Various disclosed switch topologies may provide a finite off-state resistance, which enables a fast settling process (which is advantageous compared to the NMOS-only switch 200c). The PMOS-grounded switch 400 may be implemented with a simple physical realization, which could be accommodated to existing varactor matrices built upon state-of-the art switches, that is, no additional supply voltage, no additional control, or additional analog signals (advantage compared to the proposed CMOS-biased topology). The CMOS-biased switch 500 provides a robust off-state resistance with large DCO amplitudes (which is advantageous compared to the PMOS-grounded switch 400). In addition, the topology utilizes and auxiliary programmable voltage, which can be used to tradeoff off-state impedance and DCO phase noise. The programmability can also be used to compensate the switch parameters against process variations.

For the purposes of promoting an understanding of the principles of this disclosure, reference has been made to the various configurations illustrated in the drawings, and specific language has been used to describe these configurations. However, no limitation of the scope of the inventive subject matter is intended by this specific language, and the inventive subject matter should be construed to encompass all aspects and configurations that would normally occur to one of ordinary skill in the art. The configurations herein may be described in terms of functional block components and various processing steps. Such functional blocks may be realized by any number of components that perform the specified functions. The particular implementations shown and described herein are illustrative examples and are not intended to otherwise limit the scope of the inventive subject matter in any way. The connecting lines, or connectors shown in the various figures presented may, in some instances, be intended to represent example functional relationships and/or physical or logical couplings between the various elements. However, many alternative or additional functional relationships, physical connections or logical connections may be present in a practical device. Moreover, no item or component is essential unless the element is specifically described as "essential" or "critical". Numerous modifications and adaptations will be readily apparent to those skilled in this art.

EXAMPLES

Example 1 is a switch circuit for a digitally controlled oscillator having a low varactor switching transient, comprising: a main switch device comprising a gate connected to a control terminal, a drain connected to a first terminal that is connected to the first capacitor, and a source connected to a second terminal that is connected to the second capacitor; a first n-channel metal-oxide semiconductor (NMOS) device comprising a gate connected to the main switch device gate, a source connected to a ground, and a drain connected to the first terminal; a second NMOS device comprising a gate connected to the main switch device gate, a source connected to a ground, and a drain connected to the second terminal; and a pair of p-channel metal-oxide semiconductor (PMOS) devices each comprising drains connected respectively to the first and second terminals and configured to provide a finite resistance and predefined direct current (DC) voltage to the first and second NMOS devices when an off control signal is applied to the control terminal and the main switch device and NMOS devices are in an off state.

In Example 2, the subject matter of Example 1 optionally includes wherein the pair of PMOS devices comprises: a first PMOS device, comprising: a gate connected to a PMOS common junction; a source connected to the PMOS common junction; and the drain that is connected to the first terminal; and a second PMOS device, comprising: a gate connected to the PMOS common junction; a source connected to the PMOS common junction; and the drain that is connected to the second terminal.

In Example 3, the subject matter of Example 2 optionally includes wherein the PMOS common junction is connected to the ground.

In Example 4, the subject matter of any one or more of Examples 2-3 optionally include wherein the PMOS common junction is connected to a bias voltage point.

Example 5 is a switch circuit for a varactor matrix of a digitally controlled oscillator, comprising: a main switch device, comprising: a gate connected to a control terminal, a drain connected to a first terminal, and a source connected to a second terminal; a first n-channel metal-oxide semiconductor (NMOS) device, comprising: a gate connected to the main switch device gate, a drain connected to the first terminal, and a source connected to a ground; a second NMOS device, comprising: a gate connected to the main switch device gate, a drain connected to the second terminal, and a source connected to the ground; a first p-channel metal-oxide semiconductor (PMOS) device, comprising: a source, and a drain connected to the first terminal; a second PMOS device, comprising: a source, and a drain connected to the second terminal; a third PMOS device, comprising a drain connected to the source of the first PMOS device; and a fourth PMOS device, comprising a drain connected to the source of the second PMOS device.

In Example 6, the subject matter of Example 5 optionally includes wherein a first PMOS device gate and a second PMOS device gate are connected to a common first PMOS junction.

In Example 7, the subject matter of Example 6 optionally includes wherein the common first PMOS junction is connected to the main switch device gate.

In Example 8, the subject matter of any one or more of Examples 6-7 optionally include wherein the common first PMOS junction is connected to an auxiliary voltage terminal or to the ground.

In Example 9, the subject matter of any one or more of Examples 5-8 optionally include wherein a third PMOS device gate and a fourth PMOS device gate are connected to a common second PMOS junction.

In Example 10, the subject matter of Example 9 optionally includes wherein the common second PMOS junction is connected to the main switch device gate.

In Example 11, the subject matter of any one or more of Examples 9-10 optionally include wherein the common second PMOS junction is connected to an auxiliary voltage terminal.

In Example 12, the subject matter of any one or more of Examples 9-11 optionally include wherein the common second PMOS junction is connected to the ground.

In Example 13, the subject matter of any one or more of Examples 5-12 optionally include wherein a third PMOS device source and a fourth PMOS device source are connected to a common third PMOS junction.

In Example 14, the subject matter of Example 13 optionally includes wherein the common third PMOS junction is connected to an auxiliary voltage terminal.

In Example 15, the subject matter of Example 14 optionally includes wherein: a first PMOS device gate and a second PMOS device gate are connected to a common first PMOS junction that is connected to the ground; and a third PMOS device gate and a fourth PMOS device gate are connected to a common second PMOS junction that is connected to the main switch device gate.

In Example 16, the subject matter of any one or more of Examples 14-15 optionally include wherein: a first PMOS device gate and a second PMOS device gate are connected to a common first PMOS junction that is connected to the main switch device gate; and a third PMOS device gate and a fourth PMOS device gate are connected to a common second PMOS junction that is connected to the ground.

In Example 17, the subject matter of any one or more of Examples 14-16 optionally include wherein: a first PMOS device gate and a second PMOS device gate are connected to a common first PMOS junction that is connected to the main switch device gate; and a third PMOS device gate and a fourth PMOS device gate are connected to a common second PMOS junction that is connected to the main switch device gate.

In Example 18, the subject matter of any one or more of Examples 14-17 optionally include wherein: a first PMOS device gate and a second PMOS device gate are connected to a common first PMOS junction that is connected to the third PMOS junction; and a third PMOS device gate and a fourth PMOS device gate are connected to a common second PMOS junction that is connected to the third PMOS junction.

Example 19 is a digitally controlled oscillator comprising means to perform any of the methods of Examples m19-m22.

Example 20 is a digitally controlled oscillator (DCO), comprising: an inductor; and a varactor matrix unit connected in parallel with the inductor; wherein: the varactor matrix unit comprises a first and second capacitor and a switch connected between the first and second capacitors; the switch comprises: a main switch device comprising a gate connected to a control terminal, a drain connected to a first terminal that is connected to the first capacitor, and a source connected to a second terminal that is connected to the second capacitor; a first n-channel metal-oxide-semiconductor (NMOS) device comprising a gate connected to the main switch device gate, a source connected to a ground, and a drain connected to the first terminal; a second NMOS device comprising a gate connected to the main switch device gate, a source connected to a ground, and a drain connected to the second terminal; and a pair of p-channel metal-oxide-semiconductor (PMOS) devices each comprising drains connected respectively to the first and second terminals and configured to provide a finite resistance and predefined direct current (DC) voltage to the first and second NMOS devices when an off control signal is applied to the control terminal and the main switch device and NMOS devices are in an off state; and the inductor and varactor matrix unit are configured to produce an oscillating signal via inductance of the inductor and capacitance of the varactor matrix.

In Example 21, the subject matter of Example 20 optionally includes wherein the pair of PMOS devices comprises: a first PMOS device, comprising: a gate connected to a PMOS common junction; a source connected to the PMOS common junction; and the drain that is connected to the first terminal; and a second PMOS device, comprising: a gate connected to the PMOS common junction; a source connected to the PMOS common junction; and the drain that is connected to the second terminal.

Example 22 is a method of operating a varactor matrix switch, comprising: receiving an off control signal defining a switch off state at a gate of a main switch device; turning off the main switch device in response to the off control signal; turning off a first n-channel metal-oxide semiconductor (NMOS) device comprising a gate connected to the main switch device gate in response to the off control signal; turning off a second NMOS device comprising a gate connected to the main switch device gate in response to the off control signal; connecting a finite resistance and predefined direct current (DC) voltage to the first NMOS device at a first terminal connection that connects a drain of the main switch device, a drain of the first NMOS device, and a drain of a first p-channel metal-oxide semiconductor (PMOS) device while the switch is in the off state; and connecting a finite resistance and predefined DC voltage to the second NMOS device at a second terminal connection that connects a source of the main switch device, a drain of the second NMOS device, and a drain of a second PMOS device while the switch is in the off state; wherein: connecting the finite resistance and predefined DC voltage to the first NMOS device comprises passing a signal received at the first terminal through a drain and a gate of the first PMOS device with the first element gate and source being connected to ground; and connecting the finite resistance and predefined DC voltage to the second NMOS device comprises passing a signal received at the second terminal through a drain and a gate of the second PMOS device with the first element gate and source being connected to ground.

In Example 23, the subject matter of Example 22 optionally includes wherein the pair of PMOS devices comprises: a first PMOS device, comprising: a gate connected to a PMOS common junction, a source connected to the PMOS common junction, and the drain that is connected to the first terminal; and a second PMOS device, comprising: a gate connected to the PMOS common junction, a source connected to the PMOS common junction, and the drain that is connected to the second terminal.

In Example 24, the subject matter of Example 23 optionally includes wherein the PMOS common junction is connected to the ground.

In Example 25, the subject matter of any one or more of Examples 23-24 optionally include wherein the PMOS common junction is connected to a bias voltage point.

Example 26 is a digitally controlled oscillator comprising: means for receiving an off control signal defining a switch off state at a gate of a main switch device; means for means for turning off the main switch device in response to the off control signal; means for turning off a first n-channel metal-oxide semiconductor (NMOS) device comprising a gate connected to the main switch device gate in response to the off control signal; means for turning off a second NMOS device comprising a gate connected to the main switch device gate in response to the off control signal; means for connecting a finite resistance and predefined direct current (DC) voltage to the first NMOS device at a first terminal connection that connects a drain of the main switch device, a drain of the first NMOS device, and a drain of a first p-channel metal-oxide semiconductor (PMOS) device while the switch is in the off state; and means for connecting a finite resistance and predefined DC voltage to the second NMOS device at a second terminal connection that connects a source of the main switch device, a drain of the second NMOS device, and a drain of a second PMOS device while the switch is in the off state; wherein: the means for connecting the finite resistance and predefined DC voltage to the first NMOS device comprises passing a signal received at the first terminal through a drain and a gate of the first PMOS device with the first element gate and source being connected to ground; and the means for connecting the finite resistance and predefined DC voltage to the second NMOS device comprises passing a signal received at the second terminal through a drain and a gate of the second PMOS device with the first element gate and source being connected to ground.

In Example 27, the subject matter of Example 26 optionally includes wherein the pair of PMOS devices comprises: a first PMOS device, comprising: a gate connected to a PMOS common junction, a source connected to the PMOS common junction, and the drain that is connected to the first terminal; and a second PMOS device, comprising: a gate connected to the PMOS common junction, a source connected to the PMOS common junction, and the drain that is connected to the second terminal.

In Example 28, the subject matter of any one or more of Examples 26-27 optionally include wherein the PMOS common junction is connected to the ground.

In Example 29, the subject matter of any one or more of Examples 26-28 optionally include wherein the PMOS common junction is connected to a bias voltage point.

The invention claimed is:
1. A switch circuit for a digitally controlled oscillator having a low varactor switching transient, comprising:

a main switch device comprising a gate connected to a control terminal, a drain connected to a first terminal that is connected to a first capacitor, and a source connected to a second terminal that is connected to a second capacitor;

a first n-channel metal-oxide semiconductor (NMOS) device comprising a gate connected to the main switch device gate, a source connected to a ground, and a drain connected to the first terminal;

a second NMOS device comprising a gate connected to the main switch device gate, a source connected to the ground, and a drain connected to the second terminal; and a first and a second p-channel metal-oxide semiconductor (PMOS) device each comprising a gate and a source each connected to a PMOS common junction, the PMOS common junction connected to the ground, a drain of the first PMOS device connected to the first terminal, and a drain of the second PMOS device connected to the second terminal, wherein the first and second PMOS devices are configured to provide a finite resistance and predefined direct current (DC) voltage to the first and second NMOS devices when an off control signal is applied to the control terminal and the main switch device and the NMOS devices are in an off state.

2. A switch circuit for a varactor matrix of a digitally controlled oscillator, comprising:

a main switch device, comprising: a gate connected to a control terminal, a drain connected to a first terminal, and a source connected to a second terminal;

a first n-channel metal-oxide semiconductor (NMOS) device, comprising: a gate connected to the main switch device gate, a drain connected to the first terminal, and a source connected to a ground;

a second NMOS device, comprising: a gate connected to the main switch device gate, a drain connected to the second terminal, and a source connected to the ground;

a first p-channel metal-oxide semiconductor (PMOS) device, comprising: a source, and a drain connected to the first terminal;

a second PMOS device, comprising: a source, and a drain connected to the second terminal;

a third PMOS device, comprising a drain connected to the source of the first PMOS device; and a fourth PMOS device, comprising a drain connected to the source of the second PMOS device.

3. The switch of claim 2, wherein a first PMOS device gate and a second PMOS device gate are connected to a common first PMOS junction.

4. The switch of claim 3, wherein the common first PMOS junction is connected to the main switch device gate.

5. The switch of claim 3, wherein the common first PMOS junction is connected to an auxiliary voltage terminal or to the ground.

6. The switch of claim 2, wherein a third PMOS device gate and a fourth PMOS device gate are connected to a common second PMOS junction.

7. The switch of claim 6, wherein the common second PMOS junction is connected to the main switch device gate.

8. The switch of claim 6, wherein the common second PMOS junction is connected to an auxiliary voltage terminal.

9. The switch of claim 6, wherein the common second PMOS junction is connected to the ground.

10. The switch of claim 2, wherein a third PMOS device source and a fourth PMOS device source are connected to a common third PMOS junction.

11. The switch of claim 10, wherein the common third PMOS junction is connected to an auxiliary voltage terminal.

12. The switch of claim 11, wherein:
a first PMOS device gate and a second PMOS device gate are connected to a common first PMOS junction that is connected to the ground; and
a third PMOS device gate and a fourth PMOS device gate are connected to a common second PMOS junction that is connected to the main switch device gate.

13. The switch of claim 11, wherein:
a first PMOS device gate and a second PMOS device gate are connected to a common first PMOS junction that is connected to the main switch device gate; and
a third PMOS device gate and a fourth PMOS device gate are connected to a common second PMOS junction that is connected to the ground.

14. The switch of claim 11, wherein:
a first PMOS device gate and a second PMOS device gate are connected to a common first PMOS junction that is connected to the main switch device gate; and
a third PMOS device gate and a fourth PMOS device gate are connected to a common second PMOS junction that is connected to the main switch device gate.

15. The switch of claim 11, wherein:
a first PMOS device gate and a second PMOS device gate are connected to a common first PMOS junction that is connected to the third PMOS junction; and
a third PMOS device gate and a fourth PMOS device gate are connected to a common second PMOS junction that is connected to the third PMOS junction.

16. A digitally controlled oscillator (DCO), comprising:
an inductor; and
a varactor matrix unit connected in parallel with the inductor;
wherein:
the varactor matrix unit comprises a first and second capacitor and a switch connected between the first and second capacitors;
the switch comprises:
a main switch device comprising a gate connected to a control terminal, a drain connected to a first terminal that is connected to the first capacitor, and a source connected to a second terminal that is connected to the second capacitor;

a first n-channel metal-oxide-semiconductor (NMOS) device comprising a gate connected to the main switch device gate, a source connected to a ground, and a drain connected to the first terminal;

a second NMOS device comprising a gate connected to the main switch device gate, a source connected to the ground, and a drain connected to the second terminal; and a pair of p-channel metal-oxide-semiconductor (PMOS) devices each comprising drains connected respectively to the first and second terminals and configured to provide a finite resistance and predefined direct current (DC) voltage to the first and second NMOS devices when an off control signal is applied to the control terminal and the main switch device and the first and second NMOS devices are each in an off state; and the inductor and varactor matrix unit are configured to produce an oscillating signal via inductance of the inductor and capacitance of the varactor matrix unit, and the pair of PMOS devices comprises:
- a first PMOS device, comprising:
  - a gate connected to a PMOS common junction;
  - a source connected to the PMOS common junction; and
  - the drain that is connected to the first terminal; and
- a second PMOS device, comprising:
  - a gate connected to the PMOS common junction;
  - a source connected to the PMOS common junction; and
  - the drain that is connected to the second terminal.

17. A method of operating a varactor matrix switch, comprising:

receiving an off control signal defining a switch off state at a gate of a main switch device;

turning off the main switch device in response to the off control signal;

turning off a first n-channel metal-oxide semiconductor (NMOS) device comprising a gate connected to the main switch device gate in response to the off control signal;

turning off a second NMOS device comprising a gate connected to the main switch device gate in response to the off control signal;

connecting a finite resistance and predefined direct current (DC) voltage to the first NMOS device at a first terminal connection that connects a drain of the main switch device, a drain of the first NMOS device, and a drain of a first p-channel metal-oxide semiconductor (PMOS) device while the switch is in the switch off state; and connecting a finite resistance and predefined DC voltage to the second NMOS device at a second terminal connection that connects a source of the main switch device, a drain of the second NMOS device, and a drain of a second PMOS device while the switch is in the switch off state;

wherein:

connecting the finite resistance and predefined DC voltage to the first NMOS device comprises passing a signal received at the first terminal through the drain and a gate of the first PMOS device with the gate and a source of the first PMOS device being connected to ground;

connecting the finite resistance and predefined DC voltage to the second NMOS device comprises passing a signal received at the second terminal through the drain and a gate of the second PMOS device with the gate and a source of the second PMOS device being connected to the ground, each of the gate and source of the first PMOS device is connected to a PMOS common junction, the drain of the first PMOS device is connected to the first terminal, and the PMOS common junction is connected to the ground, and each of the gate and source of the second PMOS device is connected to the PMOS common junction, and the drain of the second PMOS device is connected to the second terminal.

* * * * *